(12) United States Patent
Chiu et al.

(10) Patent No.: US 12,464,771 B2
(45) Date of Patent: Nov. 4, 2025

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Te-Hsin Chiu, Miaoli County (TW); Shih-Wei Peng, Hsinchu (TW); Wei-An Lai, Taichung (TW); Jiann-Tyng Tzeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 772 days.

(21) Appl. No.: 17/527,857

(22) Filed: Nov. 16, 2021

(65) Prior Publication Data
US 2022/0238679 A1    Jul. 28, 2022

Related U.S. Application Data

(60) Provisional application No. 63/140,325, filed on Jan. 22, 2021.

(51) Int. Cl.
*H01L 23/48* (2006.01)
*H10D 30/01* (2025.01)
(Continued)

(52) U.S. Cl.
CPC ....... *H10D 30/6735* (2025.01); *H01L 23/481* (2013.01); *H10D 30/031* (2025.01);
(Continued)

(58) Field of Classification Search
None
See application file for complete search history.

(56) References Cited

U.S. PATENT DOCUMENTS

2020/0203276 A1* 6/2020 Hiblot .................. H01L 21/743
2020/0219970 A1   7/2020 Mannebach et al.
(Continued)

FOREIGN PATENT DOCUMENTS

TW    201841378 A    11/2018
TW    201917893 A     5/2019

OTHER PUBLICATIONS

Taiwan Office Action issued in connection with TW Appl. Ser. No. 111102134 dated Jan. 10, 2023 without English translation (9 pages).

*Primary Examiner* — Scott B Geyer
(74) *Attorney, Agent, or Firm* — FOLEY & LARDNER LLP

(57) ABSTRACT

A semiconductor device and a method of manufacturing the device are disclosed. In one aspect, the semiconductor device includes a first active region that extends along a first lateral direction and includes a plurality of first epitaxial structures. The semiconductor device also includes an interconnect structure that also extends along the first lateral direction and is disposed below the first active region, wherein at least one of the plurality of first epitaxial structures is electrically coupled to the interconnect structure. The interconnect structure includes at least a first portion that offsets from the first active region along a second lateral direction perpendicular to the first lateral direction.

24 Claims, 21 Drawing Sheets

(51) Int. Cl.
  *H10D 30/67* (2025.01)
  *H10D 62/10* (2025.01)
(52) U.S. Cl.
  CPC ..... *H10D 30/6713* (2025.01); *H10D 30/6757* (2025.01); *H10D 62/118* (2025.01)

(56) References Cited

U.S. PATENT DOCUMENTS

| | | | |
|---|---|---|---|
| 2020/0294998 A1 | 9/2020 | Lilak et al. | |
| 2020/0381352 A1 | 12/2020 | Chou et al. | |
| 2021/0134721 A1* | 5/2021 | Chiang | H01L 29/66553 |
| 2021/0305381 A1* | 9/2021 | Chiang | H01L 29/78696 |
| 2022/0122892 A1* | 4/2022 | Smith | H01L 29/0673 |
| 2022/0139911 A1* | 5/2022 | Wei | H01L 29/78696 |
| | | | 257/365 |
| 2022/0262791 A1* | 8/2022 | Shi | H01L 29/0669 |
| 2022/0344263 A1* | 10/2022 | Peng | H01L 21/0259 |
| 2023/0067354 A1* | 3/2023 | Wei | H01L 23/5286 |
| 2023/0132353 A1* | 4/2023 | Xie | H01L 21/823431 |
| | | | 257/288 |

* cited by examiner

600A

600A

600A

SEMICONDUCTOR DEVICES AND METHODS OF MANUFACTURING THEREOF

CROSS-REFERENCE TO RELATED APPLICATION

This application claims priority to and the benefit of U.S. Provisional Application No. 63/140,325, filed Jan. 22, 2021, entitled "BACKSIDE METAL DESIGN FOR BACKSIDE POWER RAIL PROCESS ANALYSIS," which is incorporated herein by reference in its entirety for all purposes.

BACKGROUND

The semiconductor integrated circuit (IC) industry has experienced exponential growth. In semiconductor IC design, standard cells methodologies are commonly used for the design of semiconductor devices on a chip. Standard cell methodologies use standard cells as abstract representations of certain functions to integrate millions, or billions, devices on a single chip. As ICs continue to scale down, more and more devices are integrated into the single chip. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
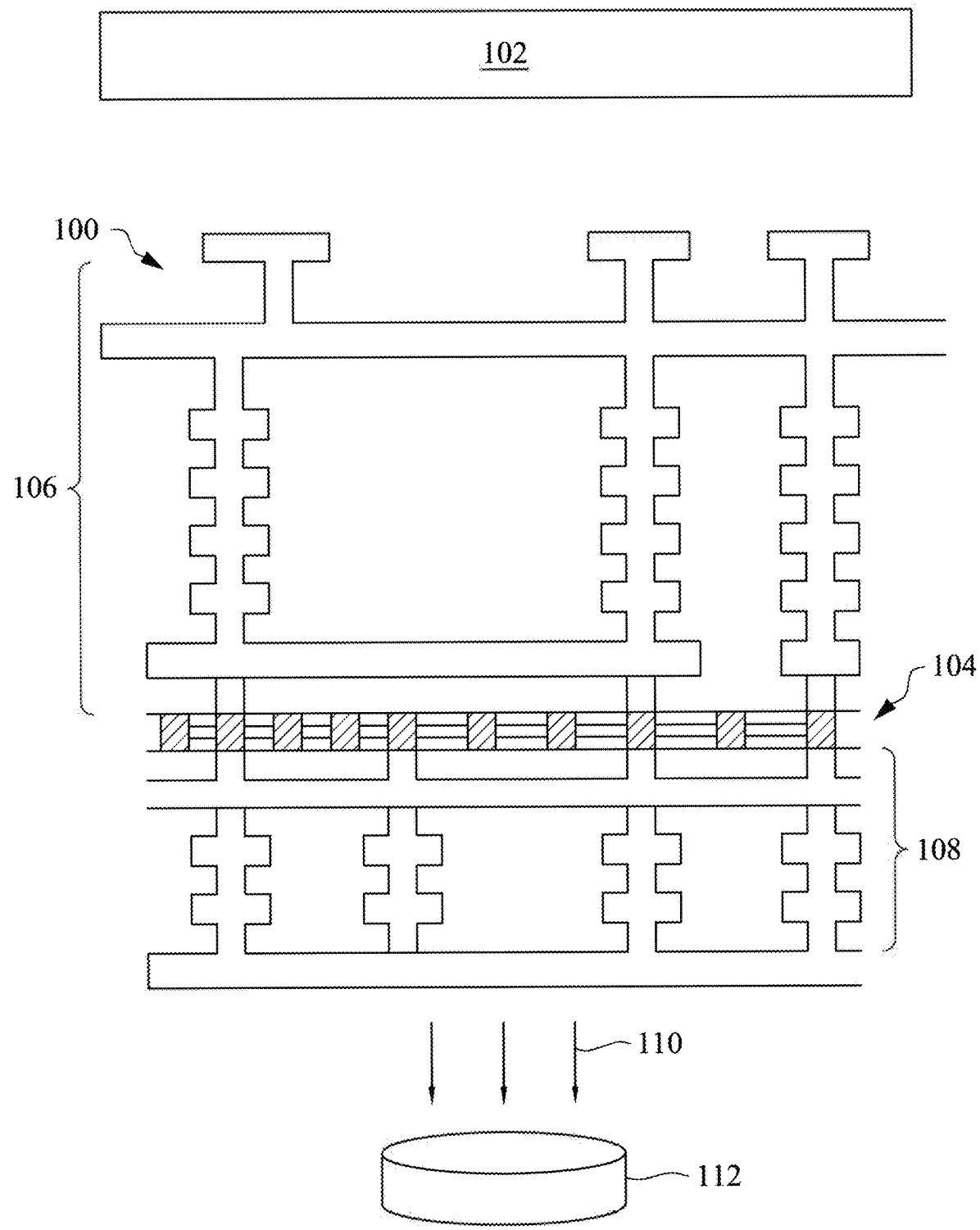
FIG. 1 illustrates a semiconductor device being tested under a tester, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a semiconductor structure and method of fabricating the same. The semiconductor structure includes a gate-all-around (GAA) field-effect-transistor (FET) structure that allows a backside power rail to electrically couple to its source and/or drain. Typically, a backside power rail is formed on the backside of a wafer in order to reduce the standard cell height of semiconductor devices. However, this causes problems in conducting failure analysis of the semiconductor devices. This is because the metal layers of the backside power rail can absorb the signals (e.g., electrons, light, etc.) present on the source and/or drain of the GAA FET. These signals are typically used to detect defects among the GAA FET and various interconnect structures formed on a front side of the wafer such as, for example, electrical shorts/opens. In the present disclosure, the backside metal of the backside power rail, at least in part, is offset from the active region (e.g., source, drain) of one or more GAA transistors. Alternatively stated, the backside power rail does not overlap with the active region such that signals present on the active region are not absorbed by any backside metals. This provides advantages in conducting failure analysis using a tester that detects the signal present on (e.g., emitted from) the active region.

FIG. 1 illustrates a semiconductor device 100 being tested under a tester 102, in accordance with some embodiments. The semiconductor device 100 includes a plurality of layers formed and/or deposited to form devices such as transistors, capacitors, wires, coils, etc. In the development of semiconductor devices, there is a front-end-of-line (FEOL) process in which the semiconductor devices such as transistors, capacitors, etc., are formed on a first side (e.g., typically referred to as a front side) of the semiconductor device 100.

There is a first back-end-of-line (BEOL) process where a number of metal interconnect structures are formed on the front side over the transistors. In addition, there is a second BEOL process where a number of metal interconnect structures are formed on a second side (e.g., typically referred to as a back side) of the semiconductor device 100. This provides reduction in standard cell heights and continuation of scaling following Moore's law.

For example in FIG. 1, the semiconductor device 100 includes a number of GAA transistors 104 formed on the front side, each of which includes a number of channel layers with two ends coupled to source/drain structures. Details of the GAA transistors will be discussed in further detail below (e.g., FIGS. 5 to 20F). On the front side, the semiconductor device 100 also includes a number of interconnect structures 106 that are (e.g., electrically and physically) coupled to one or more of the GAA transistors 104. The interconnect structures 106 are typically formed of metal, and thus, may sometimes be referred to as frontside metals. In addition, the semiconductor device 100 includes a number of interconnect structures 108, formed on the back side, that are (e.g., electrically and physically) coupled to one or more of the GAA transistors 104. The interconnect structures 108 are typically formed of metal, and thus, may sometimes be referred to as backside metals. Such interconnect structures 108 include one or more backside power rails carrying power supply voltages (e.g., $V_{DD}$, $V_{SS}$), which will be discussed below.

Use of the tester 102 may involve placing a testing device 112 facing the back side of semiconductor device 100. Testing device 112 may be, for example, a microscope, such as a photon microscope, such as an emission microscope (EMMI), an electron beam microscope, such as an electron beam irradiation microscope (EBI), or a laser scanning microscope, such as a scanning microscope using optical beam induced resistance change (OBIRCH). Testing may include applying an electrical signal through a topmost frontside interconnect layer and detecting a signal, which may comprise, for example, photons and/or electrons, such as secondary electrons, passing through the semiconductor device 100 using testing device 112. The semiconductor device 100 (or any of its components such as the transistors, wires, interconnect structures, etc.) may pass testing if no undesirable events or issues (such as unwanted electrical opens and/or shorts) have been observed or a number of undesirable events or issues is within a pre-defined threshold.

In some embodiments, the testing device 112 may be an EMMI. The EMMI may perform an emission microscopy analysis, which may be an efficient optical analysis technique used to detect and localize certain integrated circuit (IC) failures. Emission microscopy is non-invasive and can be performed from either the front or back of semiconductor devices. For example, many defects in an IC may induce faint light emission in the visible and near infrared (IR) spectrum. The EMMI may comprise a sensitive camera to view and capture these optical emissions, allowing device detecting and localizing certain IC defects. Since emissions can be detected from the back side, the EMMI may also include a laser, such as an IR laser, to create an overlay image of circuitry. This may allow failures to be related directly to circuit features, speeding up failure resolution. A typical EMMI photo may include an overlay of two images: the circuitry and the emission spots. Each may be arbitrarily colorized a different way for clarity.

Although not shown in the cross-sectional view of FIG. 1, the transistors 104 in the semiconductor device 100 include active regions which include the channels that become conductive when the transistor turns on. In existing technologies, this active region overlaps the backside power rail of the interconnect structures 108, which can cause various analysis issues as discussed above. In the present disclosure, the backside power rails are formed (e.g., patterned) to not overlap this active region, or to expose a major portion of the active region. As such, when the tester 102 is used to test the transistor for defects, the backside power rail does not absorb any signal that is emitted or generated by the active region during testing. As will be discussed in further detail below, when the semiconductor device 100 is being tested, a signal 110 (e.g., light, electrons, etc.) can be collected by a testing device 112 so that the user can accurately assess whether there is any defect (e.g., electrical open or short) in the semiconductor device 100.

Figure 2A:
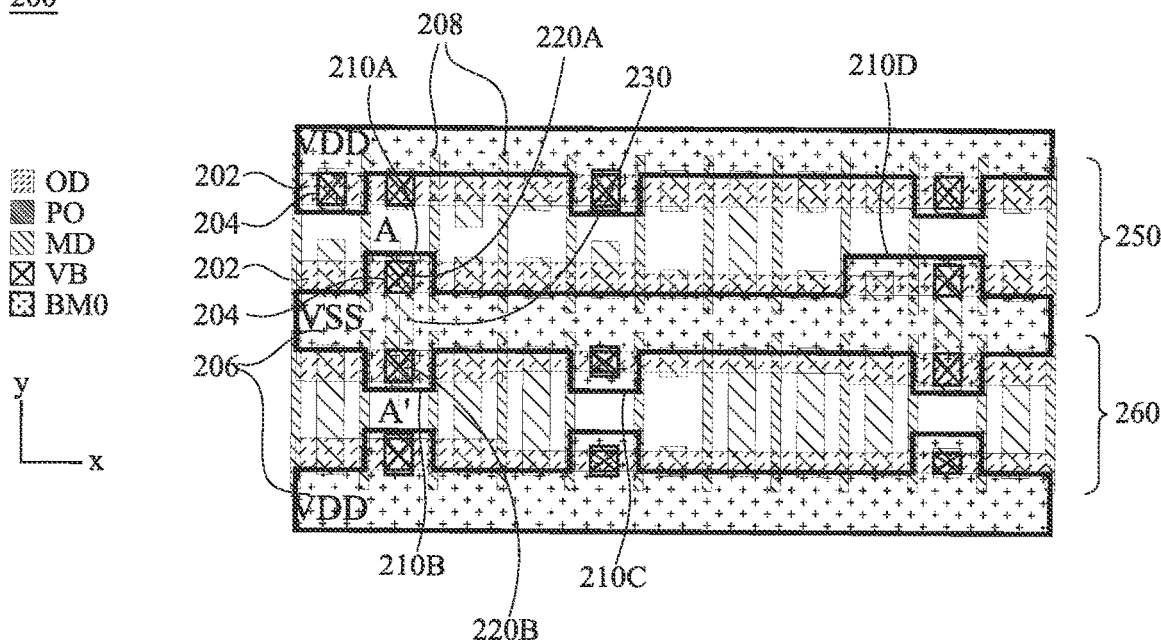
FIG. 2A illustrates an example layout design including the semiconductor device of FIG. 1, in accordance with some embodiments.

Referring to FIG. 2A, an example layout layer 200 used to form a semiconductor device is shown, in accordance with some embodiments. Such a semiconductor device can be part of the semiconductor device 100 that can be tested without the above-mentioned analysis issues, as shown in FIG. 1. Various layout layers are omitted for simplicity. The layout of FIG. 2A may correspond to a scan D-flip flop circuit, or a D-flip flop circuit with a scan input (hereinafter "SDF" circuit). For example, in FIG. 2A, the example layout layer 200 includes a plurality of patterns of a number of active regions, gate, and interconnect structures to form an SDF circuit. The example layout layer 200 includes a top row 250 and a bottom row 260 of transistors that are electrically connected to one another and formed between $V_{DD}$ and $V_{SS}$. The semiconductor device corresponding to the layout layer 200 can be formed by GAA transistors, but the disclosed technology is not limited thereto. For example, the disclosed technology can be applied to planar transistors as well as other three-dimensional devices such as FinFET devices, while remaining within the scope of present disclosure.

The example layout layer 200 includes an active region 202, backside via 204, backside metal 206, and gate 208. In various embodiments, the active region 202 and gate 208 are formed on the front side of a substrate, while the backside via 204 and backside metal 206 are formed on the backside opposite to the front side.

The active region 202 is where the conduction channel, which overlaps the gate 208, and source and drain structures are formed. The active region 202 includes a source/drain region 220A of a transistor on the top row 250 and source/drain region 220B of a transistor on the bottom row 260. The source/drain region 220A and the source/drain region 220B are electrically connected to each other through a middle interconnect structure 230.

The backside metal 206 extends in the x-direction. In some embodiments, the backside metal 206 is configured to carry a supply voltage, e.g., $V_{DD}$ or $V_{SS}$, and thus, the backside metal 206 can sometimes be referred to as a backside power rail. The backside metal 206 is patterned such that it does not overlap portions of the active region 202. For example, referring to the example layout layer 200, the backside metal 206 includes a plurality of protrusions, extending in the y-direction, that overlap the active region 202. For example, the backside metal 206 overlaps the active region 202 where there is a backside via 204 as well. Referring to the example layout layer 200, the backside metal 206 includes protrusions 210A and 210B formed on opposing ends. The protrusions 210A and 210B allow the backside metal 206 to have a bone-shaped profile. The backside metal 206 can include other protrusions such as protrusion 210C and 210D. Accordingly, as shown in FIG. 2A, the protrusions do not have to form a bone-like profile and the backside metal 206 can have protrusions only on one side and/or with different lengths.

Furthermore, although it is shown that the backside metal 206 overlap (e.g., central) portions of the source/drain regions 220A and 220B (source/drain structures 212 and 222) in the z-direction, the embodiments are not limited thereto. For example, the backside metal 206 may not overlap central portions of one or both of the source/drain regions 220A and 220B (source/drain structures 212 and 222), depending on embodiments and design. In this example, the source/drain regions 220A and 220B and source/drain structures 212 and 222 on both sides are n-doped. However, embodiments are not limited thereto, and the two sides can be p-doped or differently doped. In other words, one side can be n-doped and the other side can be p-doped.

Figure 2B:
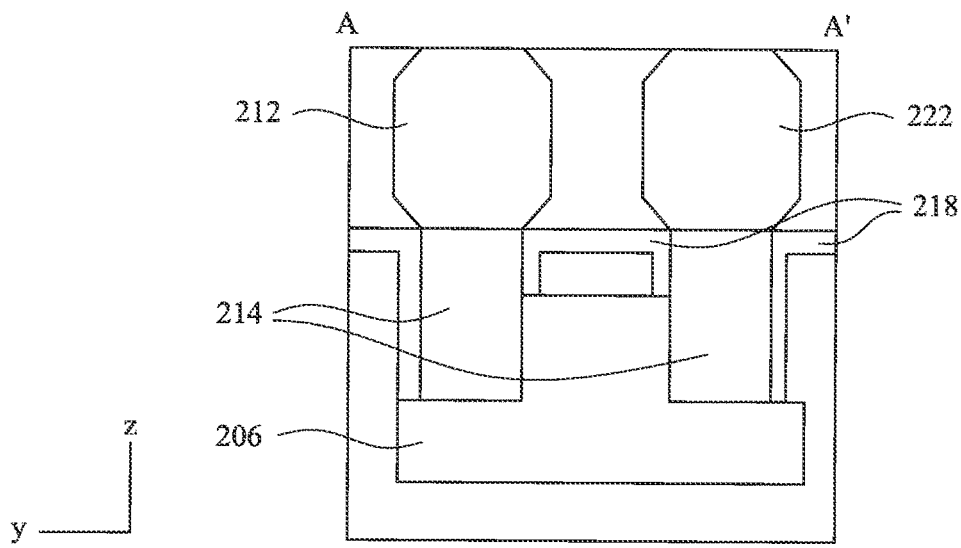
FIG. 2B illustrates a cross-sectional view at line A-A of FIG. 2A, in accordance with some embodiments.

Referring to FIG. 2B, a cross-sectional view of the example layout layer 200 at line A-A (FIG. 2A) is shown, in accordance with some embodiments. Various layers are omitted for simplicity. As discussed above with reference to FIG. 2A, the cross-section includes a source/drain region from two different transistors (e.g., source/drain region 220A and source/drain region 220B). N-type source/drain structure 212 corresponds to the source/drain region 220A, and n-type source/drain structure 222 corresponds to the source/drain region 220B.

Spacer 218 is formed around the backside via 214 except where the backside metal 206 contacts the backside via 214. Therefore, the n-type source/drain structures 212 and 222, backside vias 214, and the backside metal 206 are all electrically coupled to one another. Because the backside metal 206 is still electrically coupled to the n-type source/drain structures 212 and 222, through the backside vias 214, the backside power rail can still electrically power the semiconductor device (e.g., the transistors that include the n-type source/drain structures 212 and 222). In this way, the SDF circuit, formed using the example layout layer 200, can be tested for failure analysis using the tester 102 with greater accuracy because there is no unwanted signal being absorbed by the backside metal 206 which does not overlap the active region 202 in portions of the active region 202 without the backside vias 204/214.

Figure 3A:
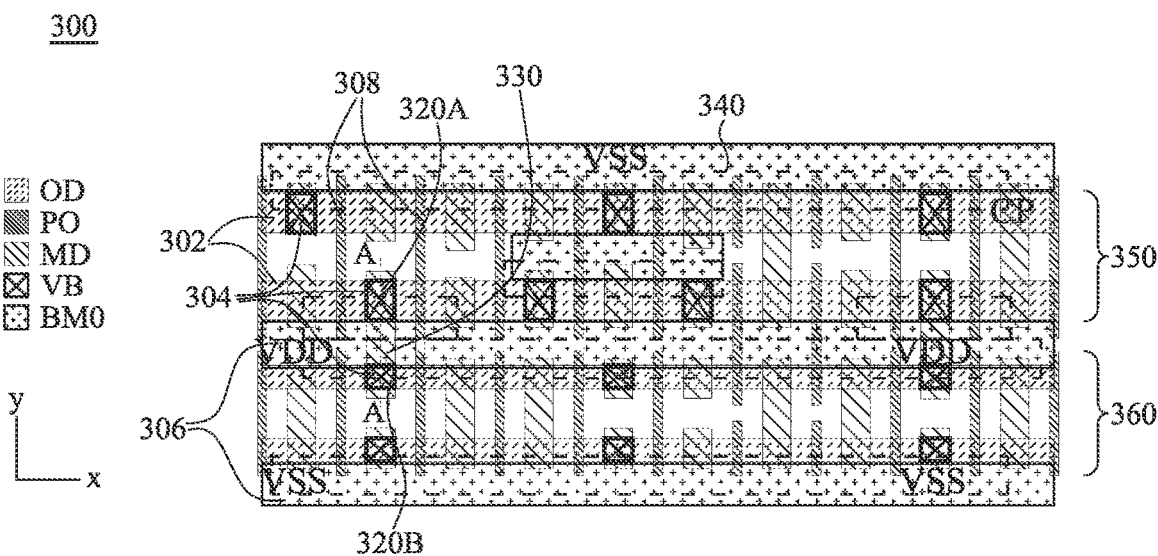
FIG. 3A illustrates an example layout design including the semiconductor device of FIG. 1, in accordance with some embodiments.

Referring to FIG. 3A, an example layout layer 300 of a semiconductor device is shown, in accordance with some embodiments. Such a semiconductor device can be part of the semiconductor device 100 that can be tested without the above-mentioned analysis issues, as shown in FIG. 1. Various layout layers are omitted for simplicity. The layout layer 300 of FIG. 3A may correspond to an SDF circuit. For example, in FIG. 3A, the example layout layer 300 includes a plurality of patterns of a number of active regions, gate, and interconnect structures to form an SDF circuit. The example layout layer 300 includes a top row 350 and a bottom row 360 of transistors that are electrically connected to one another and formed between $V_{DD}$ and $V_{SS}$. The semiconductor device corresponding to the layout layer 300 can be formed by GAA transistors, but the disclosed technology is not limited thereto. For example, the disclosed technology can be applied to planar transistors as well as other three-dimensional devices such as FinFET devices, while remaining within the scope of present disclosure.

The example layout layer 300 includes an active region 302, backside via 304, backside metal 306, and gate 308. The active region 302 is where the conduction channel, which overlaps the gate 308, and source and drain structures are formed. Further, dotted line 340 shows where the spacer is opened such that the backside via 304 is connected to the backside metal 306 (see FIG. 3B). In various embodiments, the active region 302 and gate 308 are formed on the front side of a substrate, while the backside via 304 and backside metal 306 are formed on the backside opposite to the front side.

The active region 302 includes a source/drain region 320A of a transistor on the top row 350 and source/drain region 320B of a transistor on the bottom row 360. The source/drain region 320A and the source drain region 320B are electrically connected to each other through a middle interconnect structure 330.

The backside metal 306 extends in the x-direction. In some embodiments, the backside metal 306 is configured to carry a supply voltage, e.g., $V_{DD}$ or $V_{SS}$, and thus, the backside metal 306 can sometimes be referred to as a backside power rail. The backside metal 306 is patterned such that it does not overlap the active region 302, and no protrusions are formed to overlap the backside via 304. Therefore, unlike the backside metal 206 of layer 200, the backside metal 306 is substantially rectangular. However, embodiments are not limited thereto, and the backside metal 306 may have protrusions of varying shapes and sizes that overlap the backside via 304. Accordingly, the backside metal 304 can have a bone-shaped profile.

Figure 3B:
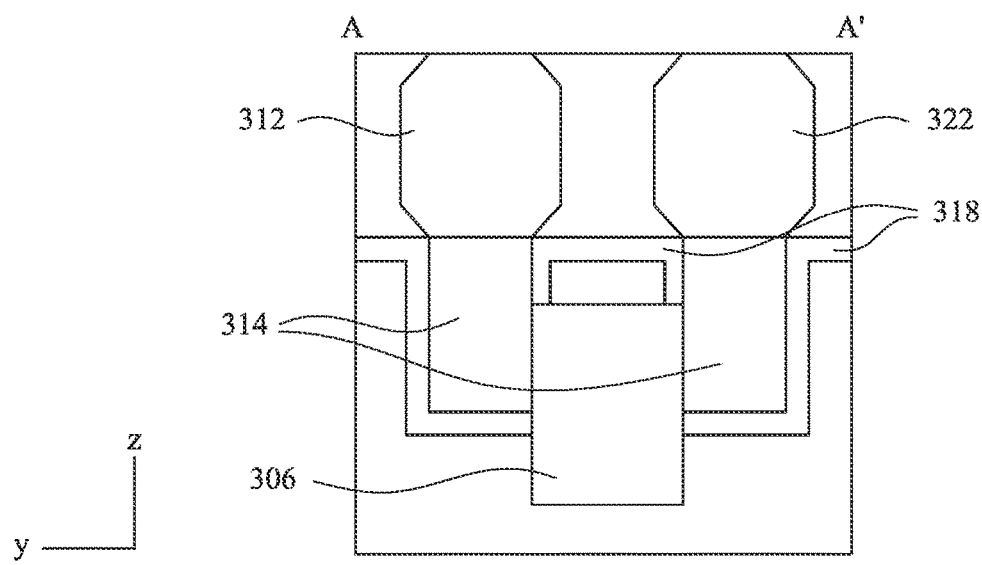
FIG. 3B illustrates a cross-sectional view at line A-A of FIG. 3A, in accordance with some embodiments.

Referring to FIG. 3B, a cross-sectional view of the example layout layer 300 at line A-A (FIG. 3A) is shown, in accordance with some embodiments. Various layers are omitted for simplicity. As discussed above with reference to FIG. 3A, the cross-section includes a source/drain region from two different transistors (e.g., source/drain region 320A and source/drain region 320B). P-type source/drain structure 312 corresponds to the source/drain region 320A, and p-type source/drain structure 322 corresponds to the source/drain region 320B.

Spacer 318 is formed around the backside via 314 except where the backside metal 306 contacts the backside via 314. Therefore, the p-type source/drain structures 312 and 322, backside vias 314, and the backside metal 306 are all electrically coupled to one another. Because the backside metal 306 is still electrically coupled to the p-type source/drain structures 312 and 322, through the backside vias 314, a user is still able to electrically power the semiconductor device (e.g., the transistors that include the p-type source/drain structures 312 and 322) using the backside power rail. Accordingly, a user can conduct a failure analysis on the SDF circuit, formed using the example layout layer 300, using the tester 102 with greater accuracy because there is no unwanted signal being absorbed by the backside metal 306 which does not overlap the active region 302 in portions of the active region 302 without the backside vias 304/314.

Furthermore, although it is shown that the backside metal 306 does not overlap central portions of the source/drain regions 320A and 320B (source/drain structures 312 and 322) in the z-direction, the embodiments are not limited thereto. For example, the backside metal 306 may overlap central portions of one or both of the source/drain regions 320A and 320B (source/drain structures 312 and 322), depending on embodiments and design. In such embodiments, the spacer 318 will be formed to not overlap the central portions of the source/drain regions 320A and 320B (source/drain structures 312 and 322) in the z-direction. In this example, the source/drain regions 320A and 320B and source/drain structures 312 and 322 on both sides are p-doped. However, embodiments are not limited thereto, and the two sides can be n-doped or differently doped. In other words, one side can be n-doped and the other side can be p-doped.

Figure 4A:
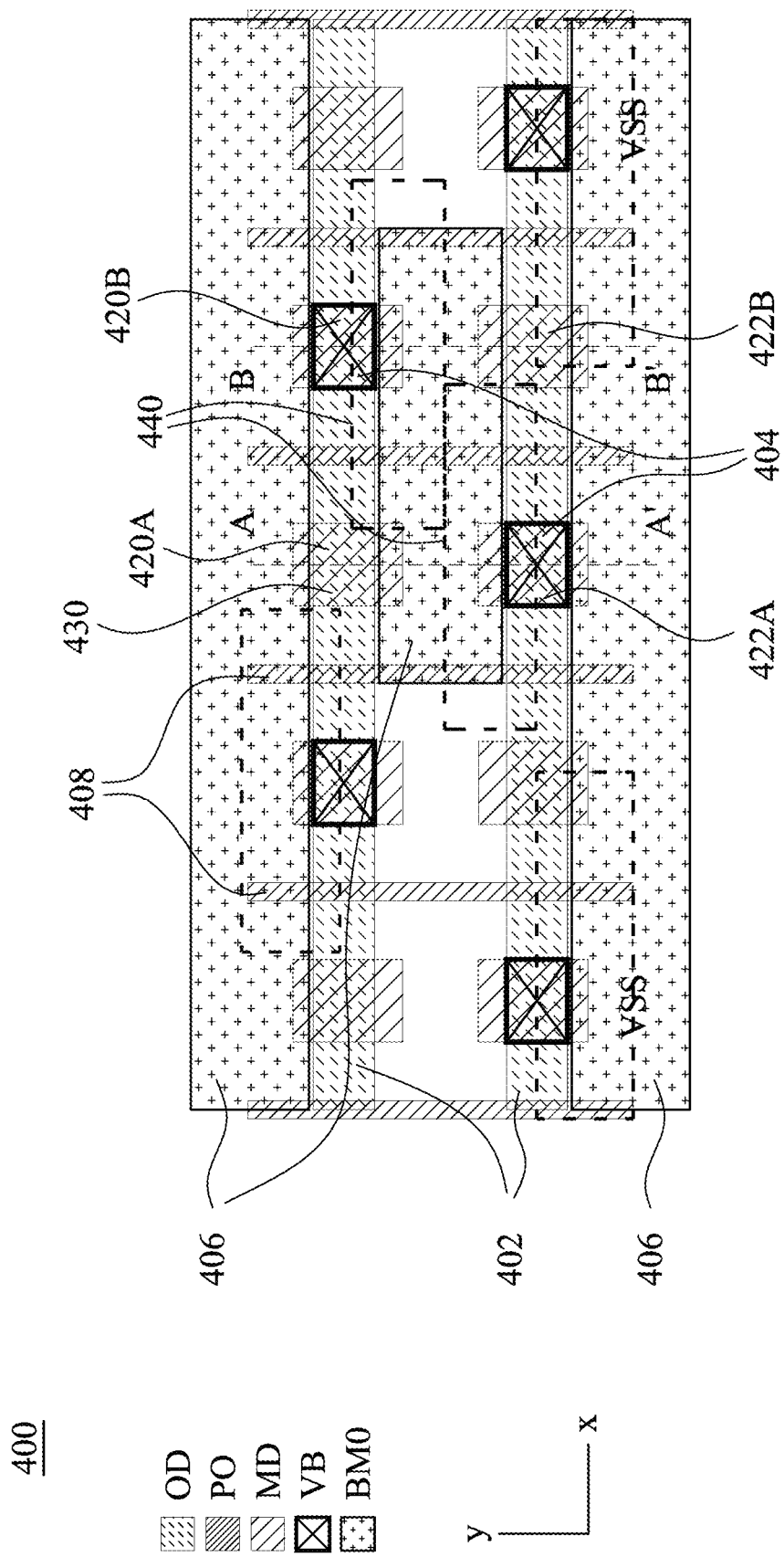
FIG. 4A illustrates another example layout design including the semiconductor device of FIG. 1, in accordance with some embodiments.

Referring to FIG. 4A, an example layout layer 400 used to form a semiconductor device is shown, in accordance with some embodiments. Such a semiconductor device can be part of the semiconductor device 100 that can be tested without the above-mentioned analysis issues, as shown in FIG. 1. Various layout layers are omitted for simplicity. The layout of FIG. 4A may correspond to an AND-OR-Invert circuit (hereinafter "AOI" circuit). For example, in FIG. 4A, the example layout layer 400 includes a plurality of patterns of a number of active regions, gate, and interconnect structures to form an AOI circuit. The example layout layer 400 includes a row of transistors that are electrically connected to one another and formed between $V_{DD}$ and $V_{SS}$. The semiconductor devices corresponding to the layout layer 400 can be formed by GAA transistors, but the disclosed technology is not limited thereto. For example, the disclosed technology can be applied to planar transistors as well as other three-dimensional devices such as FinFET devices, while remaining within the scope of present disclosure.

The example layout layer 400 includes an active region 402, backside via 404, backside metal 406, and gate 408. The active region 402 is where the conduction channel, which overlaps the gate 408, and source and drain structures are formed. Further, dotted line 440 shows where the spacer is opened such that the backside via 404 is connected to the backside metal 406 (see FIGS. 4B and 4C). In various embodiments, the active region 402 and gate 408 are formed on the front side of a substrate, while the backside via 404 and backside metal 406 are formed on the backside opposite to the front side.

The active region 402 includes source/drain regions 420A and 420B and source/drain regions 422A and 422B. The source/drain regions 420A and 420B include the source and drain of a p-type transistor, and the source/drain regions 422A and 422B include the source and drain of an n-type transistor.

The backside metal 406 extends in the x-direction. In some embodiments, the backside metal 306 is configured to carry a supply voltage, e.g., $V_{DD}$ or $V_{SS}$, and thus, the backside metal 306 can sometimes be referred to as a backside power rail. The backside metal 406 is patterned such that it does not overlap the active region 402, and no protrusions are formed to overlap the backside via 404. Therefore, unlike the backside metal 206 of layer 200, the backside metal 406 is substantially rectangular. However, embodiments are not limited thereto, and the backside metal 406 may have protrusions of varying shapes and sizes that overlap the backside via 404. Accordingly, the backside metal 404 can have a bone-shaped profile.

Figure 4B:
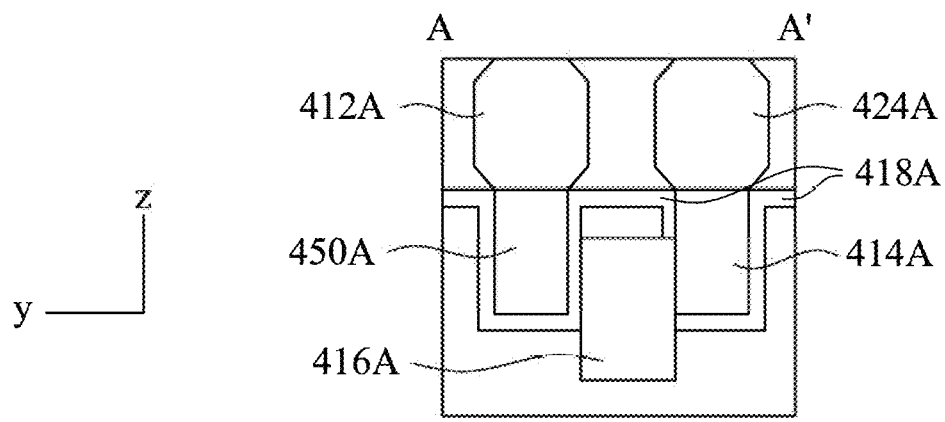
FIGS. 4B and 4C illustrate a cross-sectional view at line A-A and B-B, respectively, of FIG. 4A, in accordance with some embodiments.
Figure 4C:
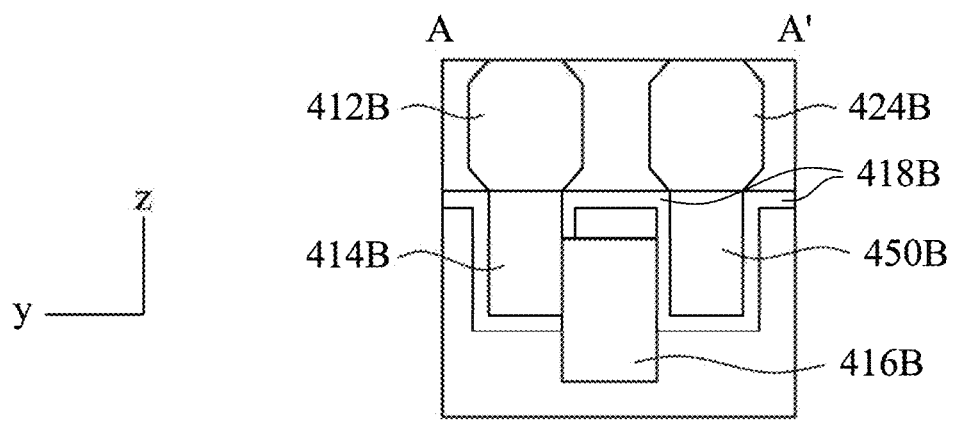

FIGS. 4B and 4C illustrate cross-sectional views of at A-A and B-B respectively. Referring to FIG. 4B, a cross-sectional view of the example layout layer 400 at line A-A (FIG. 4A) is shown, in accordance with some embodiments. Various layers are omitted for simplicity. As discussed above with reference to FIG. 4A, the cross-section includes a source/drain region from two different transistors (e.g., source/drain region 420A and source/drain region 422A). P-type source/drain structure 412A corresponds to the source/drain region 420A, and n-type source/drain structure 424A corresponds to the source/drain region 422A. The backside metal 406 includes a backside metal 416A (FIG. 4B), which is a portion of the backside metal 406 at the cross-section at A-A, and a backside metal 416B (FIG. 4C), which is a portion of the backside metal 406 at the cross-section at B-B.

Spacer 418A is formed around the backside via 414A except where the backside metal 416A contacts the backside via 414A. Furthermore, interlayer dielectric (ILD) 450A is formed below the p-type source/drain structure 412A, and the spacer 418A is formed surrounding the ILD 450A. Therefore, the p-type source/drain structure 412A is electrically isolated from the backside metal 416A, the backside via 414A, and the n-type source/drain structures 424A. On the other hand, the n-type source/drain structure 424A, backside via 414A, and the backside metal 416A are all electrically coupled to one another. Because the backside metal 416A is still electrically coupled to the n-type source/drain structure 424A, a user is still able to electrically power the semiconductor device (e.g., the transistor that includes the n-type source/drain structure 424A) using the backside power rail. Accordingly, a user can conduct a failure analysis of the AOI circuit, formed using the example layout layer 400, using the tester 102 with greater accuracy because there is no unwanted signal being absorbed by the backside metal 416A which does not overlap the active region 402 in portions of the active region 402 without the backside vias 404/414A.

Furthermore, although it is shown that the backside metal 416A does not overlap a central portion of the source/drain regions 420A and 422A (source/drain structures 412A and 424A) in the z-direction, the embodiments are not limited thereto. For example, the backside metal 416A may overlap the central portions of one or both of the source/drain regions 420A and 422A (source/drain structures 412A and 424A), depending on embodiments and design. In such embodiments, the spacer 418A will be formed to overlap the central portion of one or both of the source/drain regions 420A and 422A (source/drain structures 412A and 424A) in the z-direction. In this example, the source/drain region 420A and source/drain structure 412A are p-doped, and the source/drain region 422A and source/drain structure 424A are n-doped. However, embodiments are not limited thereto, and the two sides can be doped oppositely, depending on the layout and circuit. In other embodiments, both sides can be n-doped or p-doped.

Referring to FIG. 4C, a cross-sectional view of the example layout layer 400 at line B-B (FIG. 4A) is shown, in accordance with some embodiments. Various layers are omitted for simplicity. As discussed above with reference to FIG. 4A, the cross-section includes a source/drain region from two different transistors (e.g., source/drain region 420B and source/drain region 422B). P-type source/drain structure 412B corresponds to the source/drain region 420B, and n-type source/drain structure 424B corresponds to the source/drain region 422B.

Spacer 418B is formed around the backside via 414B except where the backside metal 416B contacts the backside via 414B. Furthermore, interlayer dielectric (ILD) 450B is formed below the n-type source/drain structure 424B, and the spacer 418B is formed surrounding the ILD 450B. Therefore, the n-type source/drain structure 424B is electrically isolated from the backside metal 416B, the backside via 414B, and the p-type source/drain structure 412B. On the other hand, the p-type source/drain structure 412B, backside via 414B, and the backside metal 416B are all electrically coupled to one another. Because the backside metal 416B is still electrically coupled to the p-type source/drain structure 412B, a user is still able to electrically power the semiconductor device (e.g., the transistor that includes the p-type source/drain structure 412B) using the backside power rail. Accordingly, a user can conduct a failure analysis of the AOI circuit, formed using the example layout layer 400, using the tester 102 with greater accuracy because there is no unwanted signal being absorbed by the backside metal 416B which does not overlap the active region 402 in portions of the active region 402 without the backside vias 404/414B.

Although it is shown that the backside metal 416B does not overlap a central portion of the source/drain regions 420B and 422B (source/drain structures 412B and 424B) in the z-direction, the embodiments are not limited thereto. For example, the backside metal 416B may overlap the central portions of one or both of the source/drain regions 420B and 422B (source/drain structures 412B and 424B), depending on embodiments and design. In such embodiments, the spacer 418B will be formed to overlap the central portion of one or both of the source/drain regions 420B and 422B (source/drain structures 412B and 424B) in the z-direction. In this example, the source/drain region 420B and source/drain structure 412B are p-doped, and the source/drain region 422B and source/drain structure 424B are n-doped. However, embodiments are not limited thereto, and the two sides can be doped oppositely, depending on the layout and circuit. In other embodiments, both sides can be n-doped or p-doped. Furthermore, referring to both FIGS. 4B and 4C, the backside vias 414A and 414B may be formed connected to the other source/drain structure (p-type source/drain structure 412A and n-type source/drain structure 424B), and the ILDs 450A and 450B may be formed on the other source/drain structure (n-type source/drain structure 424A and p-type source/drain structure 412B).

A variety of shapes for the backside metal can be used, depending on the needs of the circuit design. For example, when no open spacer pattern is used (e.g., example layout layer 200 of FIG. 2A), the backside metal can have a bone-shaped design that has one or more protruding portions. In such embodiments, the backside metal can extend in the direction that is substantially parallel to the active region and have protrusions that extend substantially perpendicularly in both directions such that the backside metal overlaps and electrically couples to selected source/drain regions via backside vias. As discussed above, the protrusions may have a variety of widths and lengths, and the protrusions may extend only in one direction and not necessarily in opposing directions. In another example, when an open spacer pattern is used (e.g., example layout layer 300 of FIG. 3A and example layout layer 400 of FIG. 4A), the backside metal can have a linear design and does not have protruding portions. In such embodiments, the backside metal extends in the direction of the active region and electrically couples to selected source/drain regions, via backside vias, where no spacer is formed. In some embodiments, the bone-shaped design may be combined with the linear design in different parts of the layout.

Figure 5:
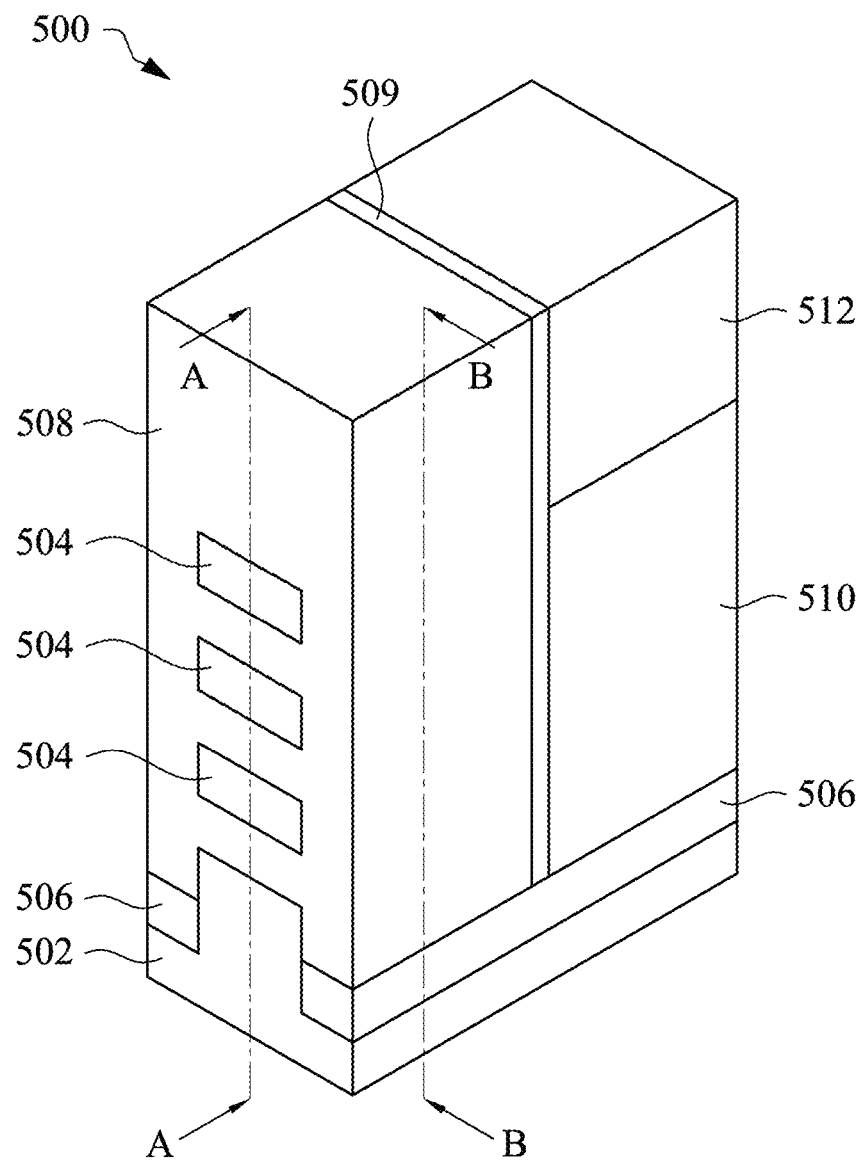
FIG. 5 illustrates a perspective view of a gate-all-around (GAA) field-effect-transistor (FET) device, in accordance with some embodiments.

FIG. 5 illustrates a perspective view of an example gate-all-around (GAA) field-effect-transistor (FET) device 500, in accordance with some embodiments. The above-mentioned GAA FET that can construct the circuits of FIGS. 2A-4C may be substantially similar to the GAA FET device 500. The GAA FET device 500 includes a substrate 502 and a number of semiconductor layers (e.g., nanosheets, nanowires, or otherwise nanostructures) 504 above the substrate 502. The semiconductor layers 504 are vertically separated from one another, which can collectively function as a (conduction) channel of the GAA FET device 500. Isolation regions/structures 506 are formed on opposing sides of a protruding portion of the substrate 502, with the semiconductor layers 504 disposed above the protruding portion. A gate structure 508 wraps around each of the semiconductor layers 504 (e.g., a full perimeter of each of the semiconductor layers 504). A spacer 509 extends along each sidewall of the gate structure 508. Source/drain structures are disposed on opposing sides of the gate structure 508 with the spacer 509 disposed therebetween, e.g., source/drain structure 510 shown in FIG. 5. An interlayer dielectric (ILD) 512 is disposed over the source/drain structure 510.

The GAA FET device shown in FIG. 5 is simplified, and thus, it should be understood that one or more features of a completed GAA FET device may not be shown in FIG. 5. For example, the other source/drain structure opposite the gate structure 508 from the source/drain structure 510 and the ILD disposed over such a source/drain structure are not shown in FIG. 5. Further, FIG. 5 is provided as a reference to illustrate a number of cross-sections in subsequent figures. As indicated, cross-section A-A is cut along a longitudinal axis of the semiconductor layers 504 and in a direction of a current flow between the source/drain structures; cross-section B-B is cut along a longitudinal axis of the gate structure 508. Subsequent figures refer to these reference cross-sections for clarity.

Figure 6:
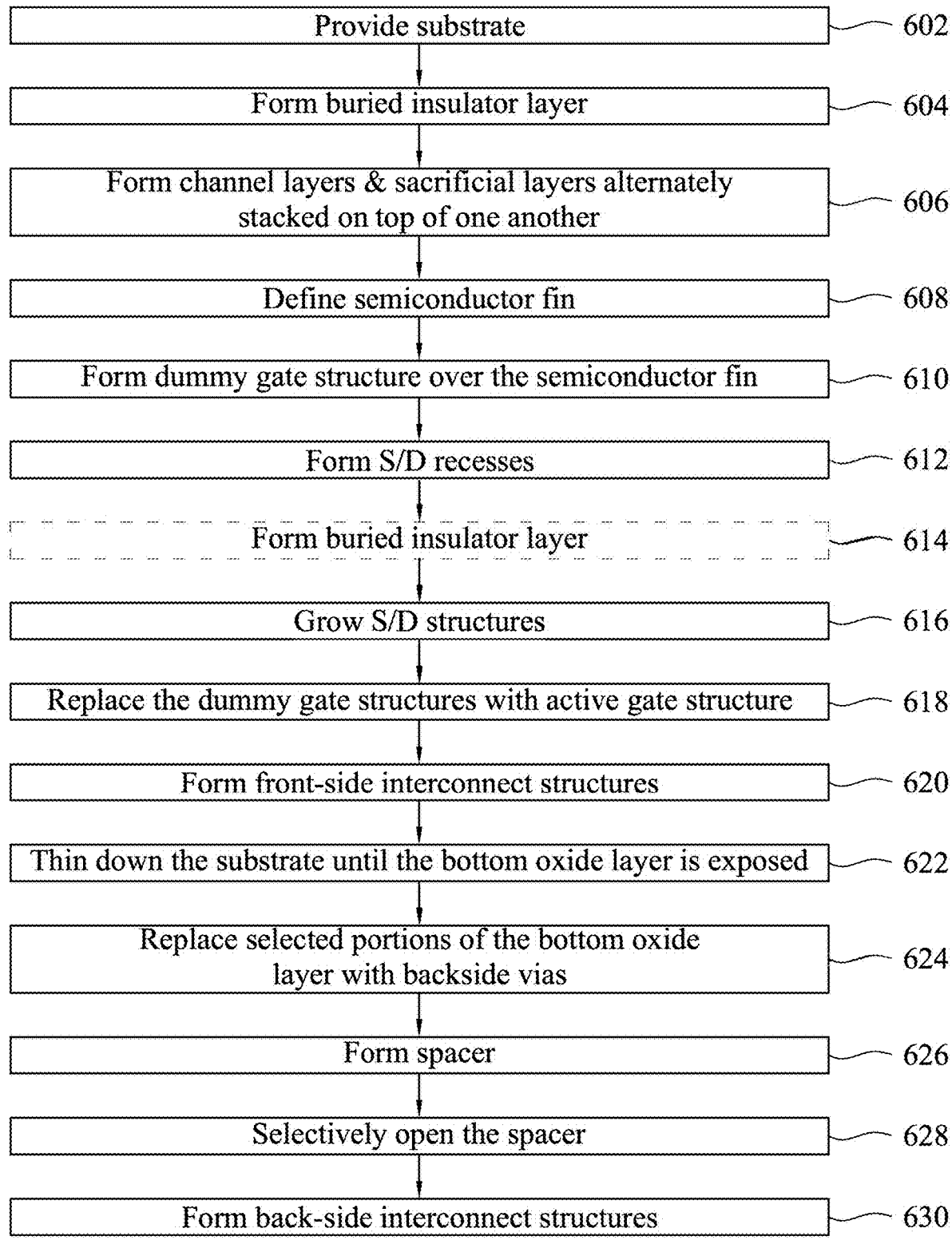
FIG. 6 illustrates a flow chart of an example method for making a non-planar transistor device including an interconnect structure, in accordance with some embodiments.

FIG. 6 illustrates a flow chart of an example method for making a GAA FET device (e.g., 500 of FIG. 5), which further includes one or more disclosed backside interconnect structures (e.g., 206 of FIGS. 2A-B, 306 of FIGS. 3A-B, 406/416A/416B of FIGS. 4A-C), in accordance with some embodiments. It should be noted that process 600 is merely an example and is not intended to limit the present disclosure. Accordingly, it is understood that additional steps/operations may be provided before, during, and after process 600 of FIG. 6, and that some other operations may only be briefly described herein. Operations of process 600 may be associated with cross-sectional views of example semiconductor device 100 at various fabrication stages as shown in FIGS. 7, 8, 9, 10, 11, 12A, 12B, 13A-13B, 14A-14B, 15A-15B, 16A-16B, 17A-17B, 18A-18B, 19A-19B, and 20A-20F respectively, which will be discussed in further detail below.

In brief overview, the process 600 starts with operation 602 of providing a substrate. Then, the process 600 can proceed to operation 604 of forming a buried oxide layer. Alternatively, the buried oxide layer may be formed later (see operation 614). Then, the process 600 proceeds to operation 606 of forming channel layers and sacrificial layers alternatively stacked on top of one another. The process 600 proceeds to operation 608 of defining the semiconductor fin. The process 600 proceeds to operation 610 of forming a dummy gate structure over the semiconductor fin. The process 600 proceeds to operation 612 of forming a source and/or drain recess. The process 600 can proceed to operation 614 of forming a buried oxide layer, if the buried oxide layer was not already formed in operation 604 (see operation 604). The process 600 proceeds to operation 616 of growing source/drain structures. The process 600 proceeds to operation 618 of replacing the dummy gate structures with an active gate structure. The process 600 proceeds to operation 620 of forming frontside interconnect structures. The process 600 proceeds to operation 622 of thinning down the substrate until the bottom oxide layer is exposed. The process 600 proceeds to operation 624 of replacing selected portions of the bottom oxide layer with backside vias. Then, the process 600 proceeds to operation 626 of forming a spacer. The process 600 proceeds to operation 628 of selectively opening the spacer. The process 600 proceeds to operation 630 of forming backside interconnect structures.

As mentioned above, FIGS. 7-20F illustrate cross-sectional views of example semiconductor devices during various fabrication stages, made by process 600, in accordance with some embodiments. For example, FIGS. 7-8 and 10-20F are cross-sectional views of the semiconductor device taken at various fabrication stages cut along line A-A of FIG. 5, and FIG. 9 is a cross-sectional view of the semiconductor device taken at a fabrication stage cut along line B-B of FIG. 5. Furthermore, the semiconductor device in some embodiments may be n-type or p-type. Although FIGS. 7-20F illustrate the semiconductor device include a GAA transistor, it is understood that the GAA transistor may include a number of other devices such as inductors, fuses, capacitors, coils, etc. which are not shown in FIGS. 7-20F for purposes of clarity of illustration.

For simplicity, FIGS. 8-11 and those with numbers ending in "A" from 12A to 20A illustrate a semiconductor device 600A at various fabrication stages when operation 604 is performed. If operation 604 is not performed, operation 614 is performed to form the buried oxide layer as shown in FIG. 12B. Accordingly, figures with numbers ending with "B" from 12B to 20B illustrate a semiconductor device 600B at various fabrication stages when operation 614 is performed. Accordingly, one of ordinary skill in the art will recognize that the buried oxide layer shown in FIGS. 8-11 will be omitted for the transistor device 600B.

Figure 7:
FIGS. 7, 8, 9, 10, 11, 12A, 12B, 13A, 13B, 14A, 14B, 15A, 15B, 16A, 16B, 17A, 17B, 18A, 18B, 19A, 19B, 20A, 20B, 20C, 20D, 20E, and 20F illustrate cross-sectional views of an example semiconductor device during various fabrication stages, made by the method of FIG. 6, in accordance with some embodiments.

Corresponding to operation 602, FIG. 7 is a cross-sectional view of the semiconductor device 600A including a semiconductor substrate 702 at one of the various stages of fabrication. The cross-sectional view of FIG. 7 is cut in a direction along the lengthwise direction of an active/dummy gate structure of the semiconductor device 600A (e.g., cross-section A-A indicated in FIG. 5.

The substrate 702 may be a semiconductor substrate, such as a bulk semiconductor, a semiconductor-on-insulator (SOI) substrate, or the like, which may be doped (e.g., with a p-type or an n-type dopant) or undoped. The substrate 702 may be a wafer, such as a silicon wafer. Other substrates, such as a multi-layered or gradient substrate may also be used. In some embodiments, the semiconductor material of the substrate 702 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 8:
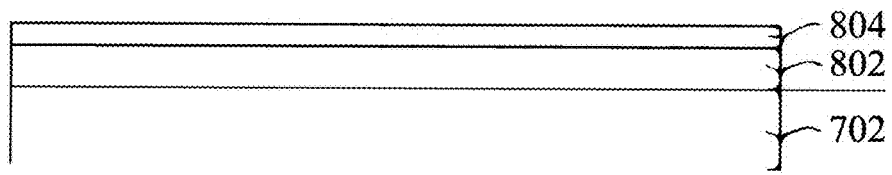
Figure 9:
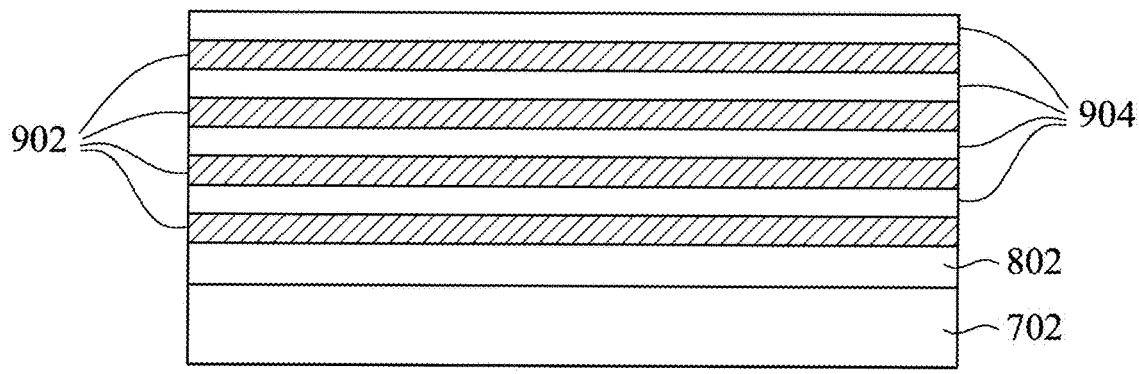

Corresponding to operation 604, FIG. 8 is a cross-sectional view of the semiconductor device 600A including a buried oxide layer 802 at one of the various stages of fabrication. The semiconductor device 600A includes a silicon on insulator (SOI) device which includes a layer of a semiconductor material 804 formed on the buried oxide layer 802. The cross-sectional view is cut along A-A indicated in FIG. 5.

As discussed above, the semiconductor device 600A includes a type of transistor in which the buried oxide layer 802 is formed over the entire substrate 702. In another embodiment, the buried oxide layer 802 can be formed later in the fabrication process (see operation 614).

Corresponding to operation 606, FIG. 9 is a cross-sectional view of the semiconductor device 600A including a plurality of sacrificial layers 902 and channel layers 904 at one of the various stages of fabrication. The cross-sectional view is cut along A-A indicated in FIG. 5.

A number of sacrificial layers 902 and a number of channel layers 904 are alternatingly disposed on top of one another to form a stack. For example, one of the channel layers 904 is disposed over one of the sacrificial layers 902, then another one of the sacrificial layers 902 is disposed over the channel layer 904, so on and so forth. The stack may include any number of alternately disposed sacrificial and channel layers 902 and 904. For example in the illustrated embodiments of FIG. 9 (and the following figures), the stack may include 4 sacrificial layers 902, with 4 channel layers 904 alternatingly disposed therebetween and with one of the channel layers 904 being the topmost semiconductor layer. It should be understood that the semiconductor device 600A can include any number of sacrificial layers and any number of channel layers, with either one of them being the topmost layer, while remaining within the scope of the present disclosure.

The layers 902 and 904 may have respective different thicknesses. Further, the sacrificial layers 902 may have different thicknesses from one layer to another layer. The channel layers 904 may have different thicknesses from one layer to another layer. The thickness of each of the layers 902 and 904 may range from few nanometers to few tens of nanometers. The first layer of the stack may be thicker than other semiconductor layers 902 and 904. In an embodiment, each of the sacrificial layers 902 has a thickness ranging from about 5 nanometers (nm) to about 20 nm, and each of the channel layers 904 has a thickness ranging from about 5 nm to about 20 nm.

The two layers 902 and 904 may have different compositions. In various embodiments, the two layers 902 and 904 have compositions that provide for different oxidation rates and/or different etch selectivity between the layers. In an embodiment, the sacrificial layers 902 may each include silicon germanium ($Si_{1-x}Ge_x$), and the channel layers may each include silicon (Si). In an embodiment, each of the channel layers 904 is silicon that may be undoped or substantially dopant-free (i.e., having an extrinsic dopant concentration from about 0 $cm^{-3}$ to about $1\times10^{17}$ $cm^{-3}$), where for example, no intentional doping is performed when forming the channel layers 904 (e.g., of silicon).

In various embodiments, the semiconductor layers 904 may be intentionally doped. For example, when the semiconductor device 600A is configured as an n-type transistor (and operates in an enhancement mode), each of the channel layers 904 may be silicon that is doped with a p-type dopant such as boron (B), aluminum (Al), indium (In), and gallium (Ga); and when the semiconductor device 600A is configured as a p-type transistor (and operates in an enhancement mode), each of the channel layers 904 may be silicon that is doped with an n-type dopant such as phosphorus (P), arsenic (As), antimony (Sb). In another example, when the semiconductor device 600A is configured as an n-type transistor (and operates in a depletion mode), each of the channel layers 904 may be silicon that is doped with an n-type dopant instead; and when the semiconductor device 600A is configured as a p-type transistor (and operates in a depletion mode), each of the channel layers 904 may be silicon that is doped with a p-type dopant instead.

In some embodiments, each of the sacrificial layers 902 is $Si_{1-x}Ge_x$ that includes less than 50% (x<0.5) Ge in molar ratio. For example, Ge may comprise about 15% to 35% of the sacrificial layers 902 of $Si_{1-x}Ge_x$ in molar ratio. Furthermore, the sacrificial layers 902 may include different compositions among them, and the channel layers 904 may include different compositions among them. Either of the layers 902 and 904 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the layers 902 and 904 may be chosen based on providing differing oxidation rates and/or etch selectivity.

The layers 902 and 904 can be epitaxially grown from the semiconductor substrate 702. For example, each of the layers 902 and 904 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 702 extends upwardly, resulting in the layers 902 and 904 having the same crystal orientation with the semiconductor substrate 702.

Figure 10:
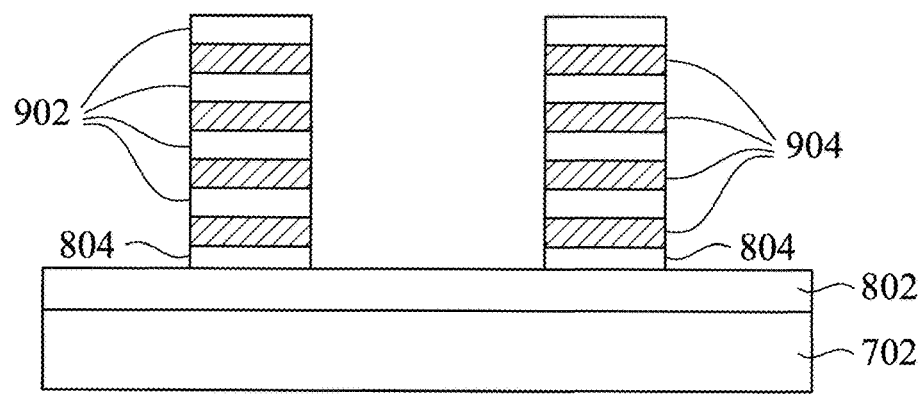

Corresponding to operation 608, FIG. 10 is a cross-sectional view of the semiconductor device 600A including a semiconductor fin 1002 at one of the various stages of fabrication. The cross-sectional view is cut along B-B indicated in FIG. 6. Upon growing the layers 902 and 904 on the semiconductor substrate 702 (as a stack), the stack may be patterned to form the fin structure 1002, as shown in FIG. 10. The fin structure is elongated along a lateral direction and includes a stack of patterned sacrificial layers 902 and channel layers 904 interleaved with each other. The fin structure 1002 is formed by patterning the stack of layers 902 and 904 and the semiconductor substrate 702 using, for example, photolithography and etching techniques.

For example, a mask layer (which can include multiple layers such as, for example, a pad oxide layer and an overlying hardmask layer) is formed over the topmost semiconductor layer of the stack (e.g., 904 in FIG. 10). The pad oxide layer may be a thin film comprising silicon oxide formed, for example, using a thermal oxidation process. The pad oxide layer may act as an adhesion layer between the topmost channel layer 904 and the hardmask layer. In some embodiments, the hardmask layer may include silicon nitride, silicon oxynitride, silicon carbonitride, the like, or combinations thereof. In some other embodiments, the hardmask layer may include a material similar as a material of the layers 902/904 such as, for example, $Si_{1-y}Ge_y$, Si, etc., in which the molar ratio (y) may be different from or similar to the molar ratio (x) of the sacrificial layers 902. The hardmask layer may be formed over the stack (i.e., before pattering the stack) using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask can be subsequently used to pattern exposed portions of the layers 902 and 904 and the substrate 702 to form the fin structure 1002, thereby defining trenches (or openings) between adjacent fin structures. When multiple fin structures are formed, such a trench may be disposed between any adjacent ones of the fin structures. In some embodiments, the fin structure 1002 is formed by etching trenches in the layers 902-904 and substrate 702 using, for example, reactive ion etching (ME), neutral beam etching (NBE), the like, or combinations thereof. The etching may be anisotropic. In some embodiments, the trenches may be strips (when viewed from the top) parallel to each other, and closely spaced with respect to each other. In some embodiments, the trenches may be continuous and surround the respective fin structures.

Figure 11:
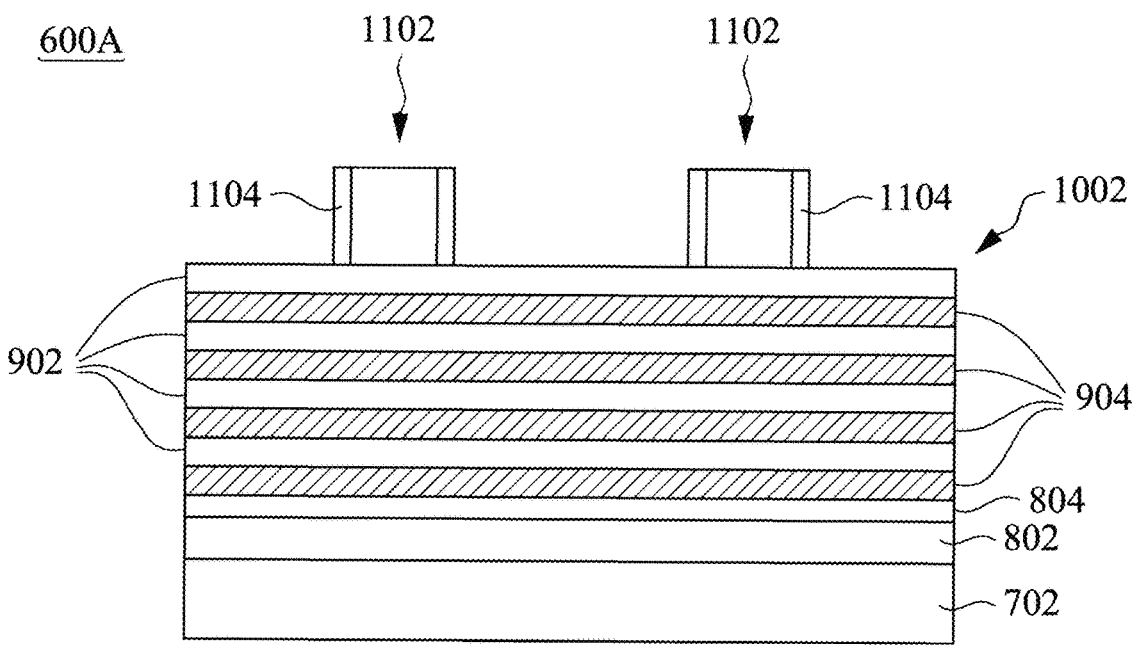

Corresponding to operation 610, FIG. 11 is a cross-sectional view of the semiconductor device 600A including a dummy gate structure 1102 at one of the various stages of fabrication. The cross-sectional view of FIG. 11 is cut in along A-A indicated in FIG. 5. The dummy gate structure 1102 is formed over the fin structure 1002.

The dummy gate structure 1102 may include a dummy gate dielectric and a dummy gate, which are not shown separately for purpose of clarity. To form the dummy gate structure 1102, a dielectric layer may be formed over the fin structure 1002. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques. Next, the pattern of the mask layer may be transferred to the gate layer and the dielectric layer by a suitable etching technique to form the dummy gate structure 1102.

Upon forming the dummy gate structure 1102, a gate spacer 1104 may be formed on opposing sidewalls of the dummy gate structure 1102, as shown in FIG. 11. The gate spacer 1104 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer 1104. The shapes and formation methods of the gate spacer 1104, as illustrated in FIG. 11, are merely non-limiting examples, and other shapes and formation methods are possible. These and other variations are fully intended to be included within the scope of the present disclosure.

Figure 12A:
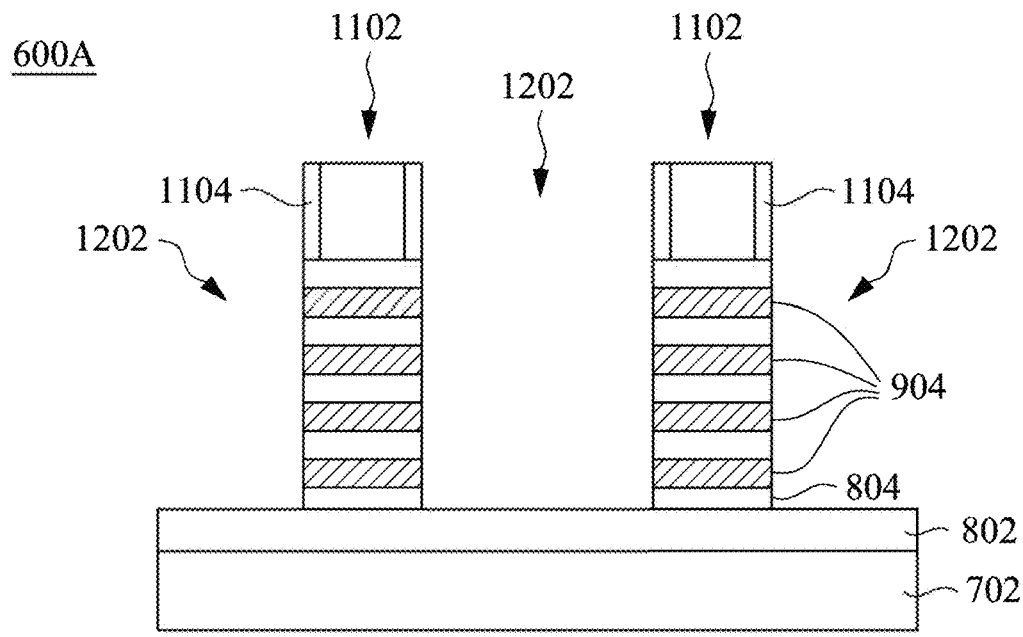
Figure 12B:
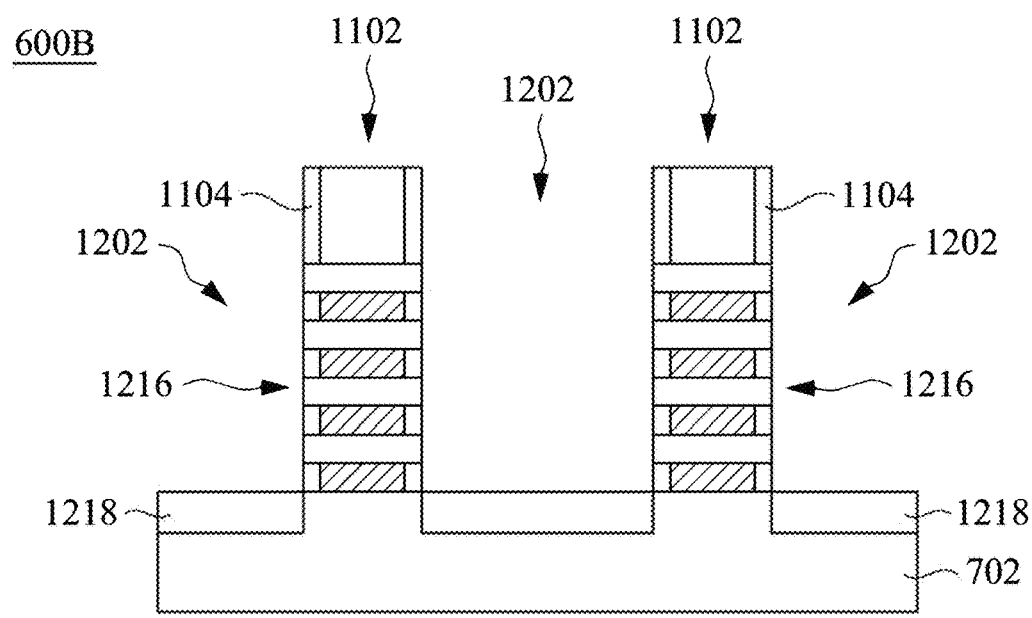

Corresponding to operation 612, FIG. 12A is a cross-sectional view of the semiconductor device 600A including a source/drain (SD) recess 1202 at one of the various stages of fabrication. The cross-sectional view is cut along A-A indicated in FIG. 5.

The dummy gate structure 1102 (together with the gate spacer 1104) can serve as a mask to recess (e.g., etch) the non-overlaid portions of the fin structure 1002, which results in the remaining fin structure 1002 having respective remaining portions of the sacrificial layers 902 and channel layers 904 alternately stacked on top of one another. As a result, recesses 1202 can be formed on opposite sides of the remaining fin structure 1002.

The recessing step to form the recesses 1202 may be configured to have at least some anisotropic etching characteristic. For example, the recessing step can include a plasma etching process, which can have a certain amount of anisotropic characteristic. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the recessing step, the gas sources and/or the passivation gases can be diluted with gases such as argon (Ar), helium (He), neon (Ne), and other suitable dilutive gases and combinations thereof to control the above-described etching rates.

Corresponding to operation 614, FIG. 12B is a cross-sectional view of the semiconductor device 600B including dummy gate structure 1102, gate spacer 1104, SD recesses 1202, fin structures 1216, and bottom oxide layer 1218 at one of the various stages of fabrication. The dummy gate structure 1102, gate spacer 1104, SD recesses 1202, fin structures 1216 can be formed using similar process and materials as those described above. The bottom oxide layer 1218 is formed after the SD recess 1202 is formed. As discussed above, unlike the semiconductor device 600A, the semiconductor device 600B does not have a buried oxide layer formed between the fin structure and substrate. The cross-sectional view is cut along A-A indicated in FIG. 5.

Figure 13A:
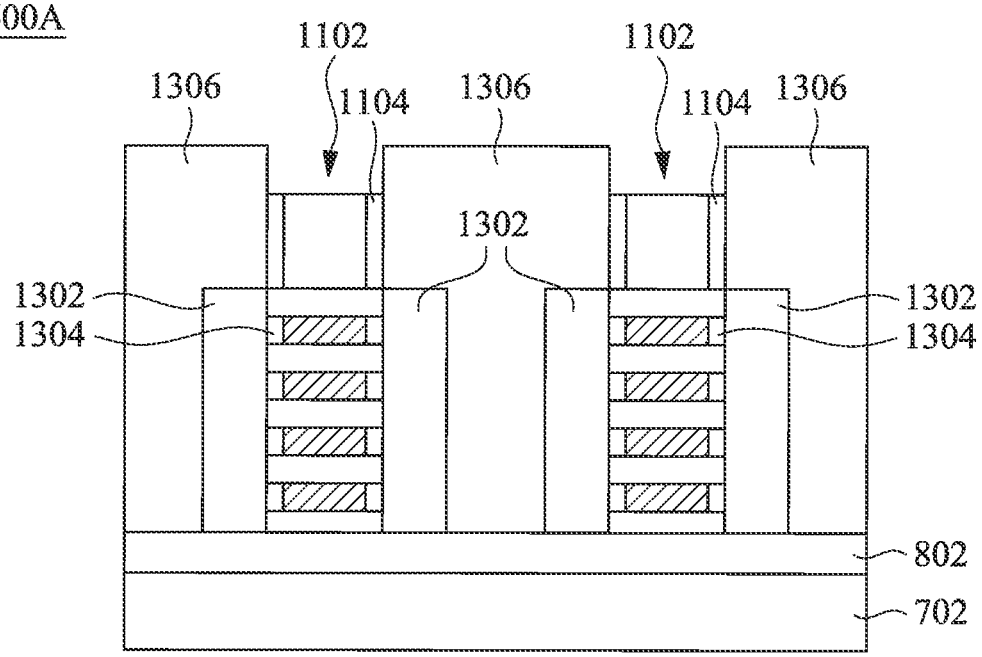
Figure 13B:
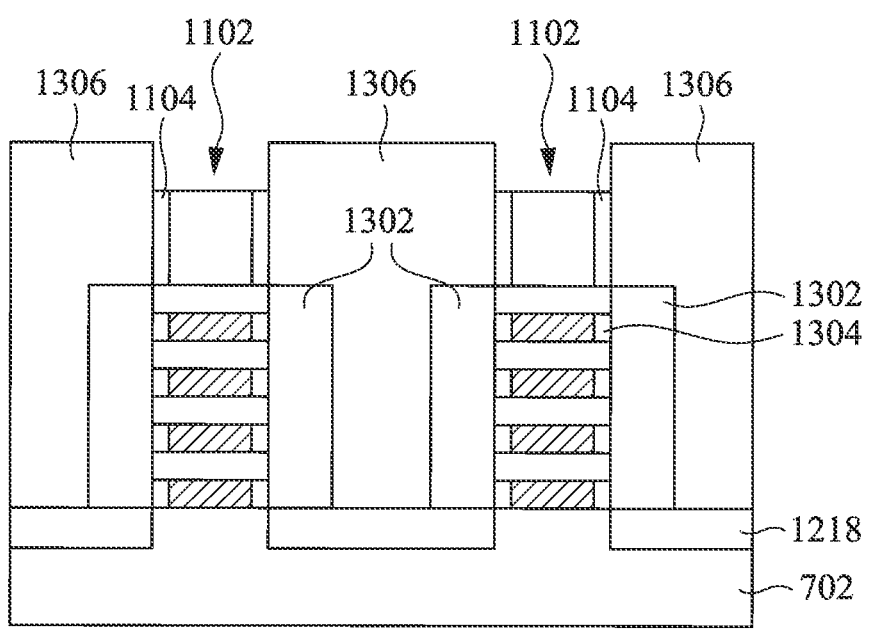

Corresponding to operation 616, FIG. 13A is a cross-sectional view of the semiconductor device 600A including source/drain structures 1302 and interlayer dielectric (ILD) 1306, at one of the various stages of fabrication, and FIG. 13B is a cross-sectional view of the semiconductor device 600B including source/drain structures 1302 and ILD 1306, at one of the various stages of fabrication. The cross-sectional views are cut along A-A indicated in FIG. 5.

The source/drain structures 1302 are disposed in the recess 1202. As such, (a lower portion of) the source/drain structure 1302 can inherit the dimensions and profiles of the recess 1202 (e.g., extending into the substrate 702). The source/drain structures 1302 are formed by epitaxially growing a semiconductor material in the recesses 1202 using suitable methods such as metal-organic CVD (MOCVD), molecular beam epitaxy (MBE), liquid phase epitaxy (LPE), vapor phase epitaxy (VPE), selective epitaxial growth (SEG), the like, or combinations thereof.

Prior to forming the source/drain structures 1302, end portions of the semiconductor layers can be removed (e.g., etched) using a "pull-back" process to pull the semiconductor layers 902 of the fin structures 1002 back by a pull-back distance. In an example where the channel layers 904 include Si, and the sacrificial layers 902 include SiGe, the pull-back process may include a hydrogen chloride (HCl) gas isotropic etch process, which etches SiGe without attacking Si. As such, the Si layers (nanostructures) 904 may remain intact during this process. Consequently, a pair of recesses can be formed on the ends of each sacrificial layer 902, with respect to the neighboring channel layers 904. Next, such recesses along the ends of each sacrificial layer 902 can be filled with a dielectric material to form inner spacers 1304, as shown in FIGS. 13A and 13B. The dielectric material for the inner spacers may include silicon nitride, silicoboron carbonitride, silicon carbonitride, silicon carbon oxynitride, or any other type of dielectric material (e.g., a dielectric material having a dielectric constant k of less than about 5) appropriate to the role of forming an insulating gate sidewall spacer for transistors.

As further shown in FIGS. 13A and 13B, the source/drain structures 1302 are disposed on the opposite sides of the fin structures 1002 to couple to the channel layers 904 of the fin structure 1002 and separate from the sacrificial layers 902 of the fin structure 1002 with the inner spacer 1304 disposed therebetween. Further, the source/drain structures 1302 are separated from the dummy gate structure 1102, with (at least a lower portion of) the gate spacer 1104.

According to various embodiments of the present disclosure, the channel layers 904 in each of the fin structures 1216 may collectively function as the conductive channel of a completed transistor. The sacrificial layers 902 in each of the fin structures may be later replaced with a portion of an active gate structure that is configured to wrap around the corresponding channel layers.

In some embodiments, the ILD 1306 can be concurrently formed to respectively overlay the source/drain structures 1302. The ILD 1306 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD is formed, an optional dielectric layer (not shown) is formed over the ILD. The dielectric layer can function as a protection layer to prevent or reduces the loss of the ILD in subsequent etching processes. The dielectric layer may be formed of a suitable material, such as silicon nitride, silicon carbonitride, or the like, using a suitable method such as CVD, PECVD, or FCVD. After the dielectric layer is formed, a planarization process, such as a CMP process, may be performed to achieve a level top surface for the dielectric layer. After the planarization process, the top surface of the dielectric layer is level with the top surface of the dummy gate structures 1102, in some embodiments.

Figure 14A:
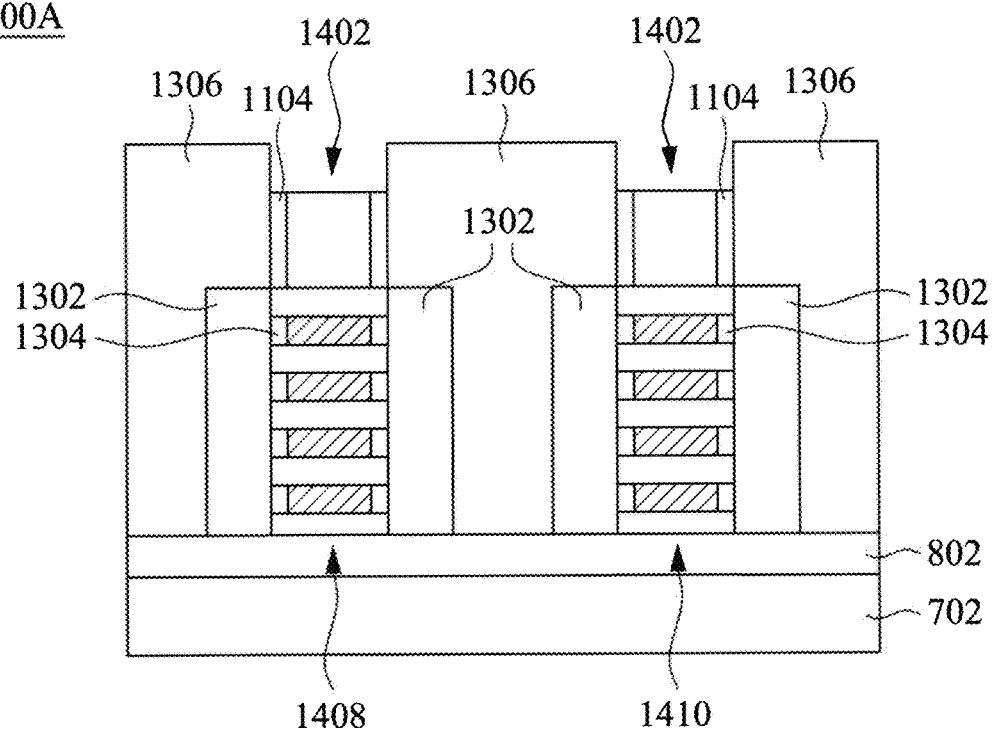
Figure 14B:
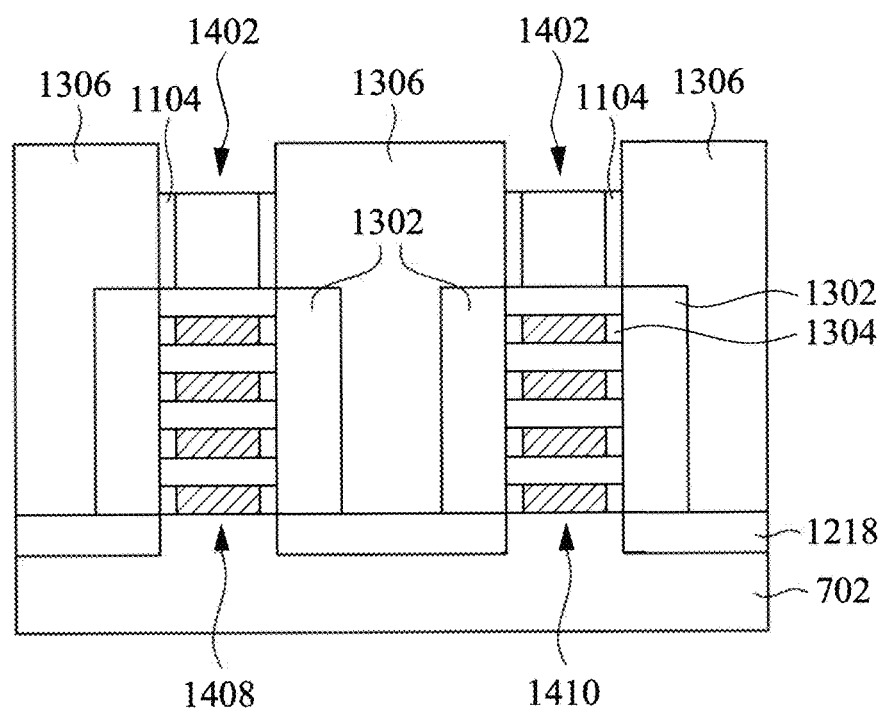

Corresponding to operation 618, FIG. 14A is a cross-sectional view of the semiconductor device 600A including active metal gates 1402, at one of the various stages of fabrication, and FIG. 14B is a cross-sectional view of the semiconductor device 600B including active metal gates 1402, at one of the various stages of fabrication. The cross-sectional views are cut along A-A indicated in FIG. 5. Referring to FIG. 14A, the semiconductor device 600A includes a GAA transistor 1404 and a GAA transistor 1406. Referring to FIG. 14B, the semiconductor device 600B includes a GAA transistor 1408 and a GAA transistor 1410.

Subsequently to forming the ILD 1306, the dummy gate structures 1102 and the (remaining) sacrificial layers 902 may be concurrently removed. In various embodiments, the dummy gate structures 1102 and the sacrificial layers 902 can be removed by applying a selective etch (e.g., a hydrochloric acid (HCl)), while leaving the channel layers 904 substantially intact. After the removal of the dummy gate structures 1102, a gate trench, exposing respective sidewalls of each of the channel layers 904 may be formed. After the removal of the sacrificial layers 902 to further extend the gate trench, respective bottom surface and/or top surface of each of the channel layers 904 may be exposed. Consequently, a full circumference of each of the channel layers 904 can be exposed. Next, the active gate structure 1402 is formed to wrap around each of the channel layers 904 of the fin (or stack) structure 1216.

The active gate structures 1402 each include a gate dielectric and a gate metal, in some embodiments. The gate dielectric can wrap around each of the channel layers 904, e.g., the top and bottom surfaces and sidewalls). The gate dielectric may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric may include a stack of multiple high-k dielectric materials. The gate dielectric can be deposited using any suitable method, including, for example, molecular beam deposition (MBD), atomic layer deposition (ALD), PECVD, and the like. In some embodiments, the gate dielectric may optionally include a substantially thin oxide (e.g., $SiO_x$) layer, which may be a native oxide layer formed on the surface of each of the channel layers 904.

The gate metal may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

Upon forming the active gate structures 1402, a number of transistors can be defined (or otherwise formed). For example, a transistor that adopts the active gate structure 1402, source/drain structures 1302 as its gate, drain, source, respectively, can be formed.

Figure 15A:
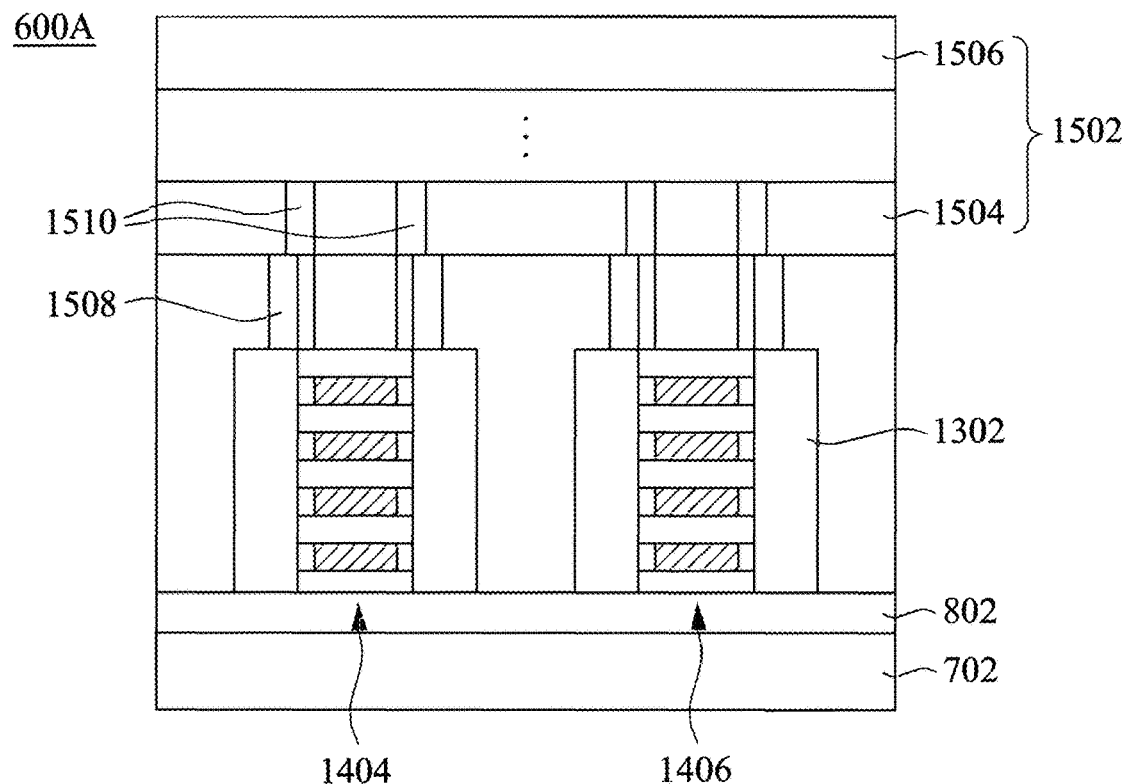
Figure 15B:
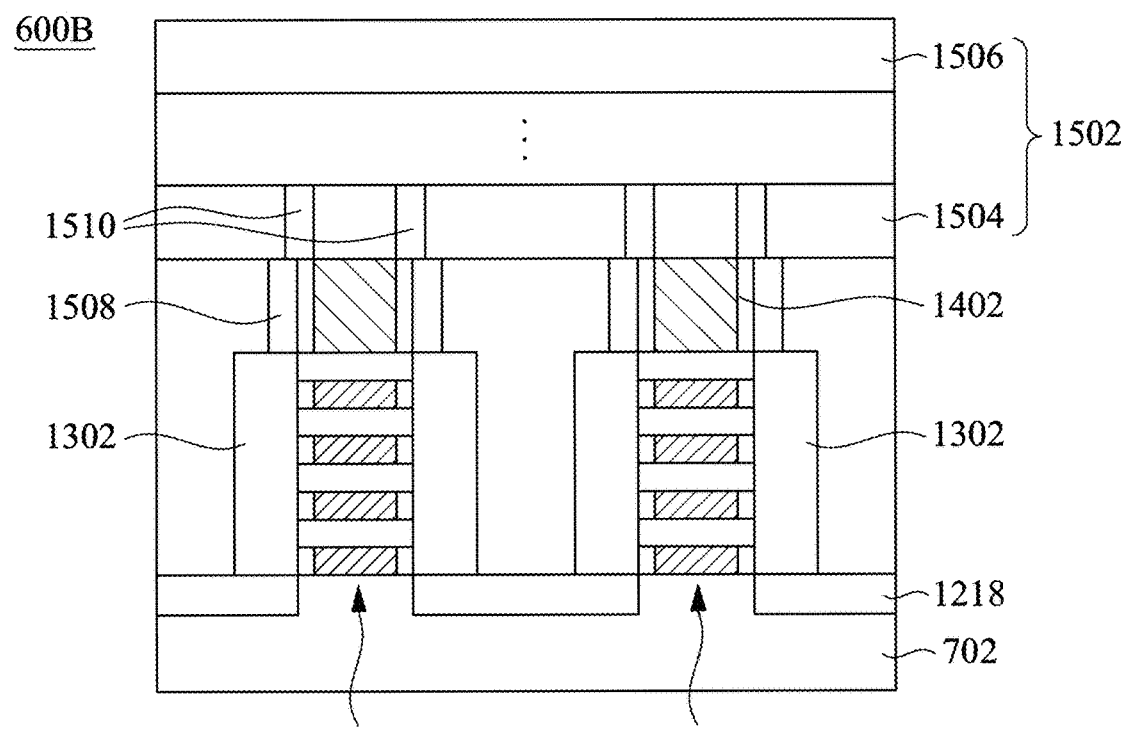

Corresponding to operation 620, FIG. 15A is a cross-sectional view of the semiconductor device 600A including frontside interconnect structures 1502, and FIG. 15B is a cross-sectional view of the semiconductor device 600B including frontside interconnect structures 1502 at one of the various stages of fabrication. The cross-sectional view is cut along A-A indicated in FIG. 5.

In both semiconductor devices 600A and 600B, the frontside interconnect structures 1502 include multiple metal layers including first interconnect structure 1504 and n-th interconnect structure 1506. The frontside interconnect structures 1502 can connect one or more of the active metal gates 1402 and/or source/drain structures 1302 of the semiconductor devices 600A or 600B together, respectively. For example in FIG. 15A, the first interconnecting structure 1504 connects the active metal gates 1402 of GAA transistor 1404 and GAA transistor 1406 together through the gate vias VG formed over the active metal gates 1402; for example in FIG. 15B, the first interconnect structure 1504 connects the gate structures 1402 of GAA transistor 1408 and GAA transistor 1410 together through the gate vias VG formed over the active metal gates 1402. Although not shown, one of ordinary skill will recognize that the frontside interconnect structures 1502 can couple the gates and/or sources and/or drains of the GAA transistors by forming vias and interconnect structures over the GAA transistors.

Figure 16A:
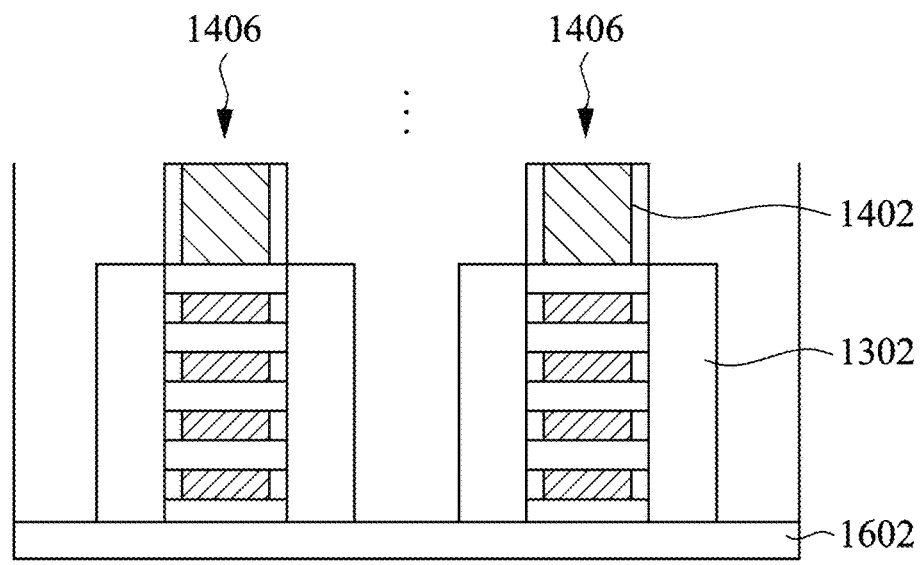
Figure 16B:
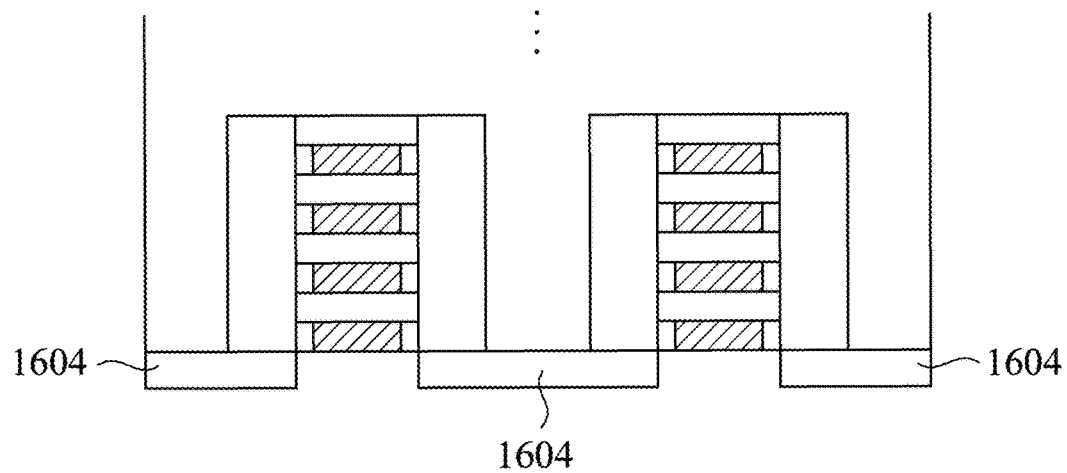

Corresponding to operation 622, FIG. 16A is a cross-sectional view of the semiconductor device 600A including a bottom oxide layer 1602, at one of the various stages of fabrication, and FIG. 16B is a cross-sectional view of the semiconductor device 600B including a bottom oxide layer 1604, at one of the various stages of fabrication. The cross-sectional views are cut along A-A indicated in FIG. 5.

Referring to FIG. 16A, the buried oxide layer 802 formed in operation 604 is exposed by thinning down the substrate 702 to expose a bottom oxide layer 1602. Referring to FIG. 16B, the buried oxide layer 1218 formed in operation 614 is exposed by thinning down the substrate 702 to expose a bottom oxide layer 1604. The substrate 702 may be thinned down by, for example, CMP.

Figure 17A:
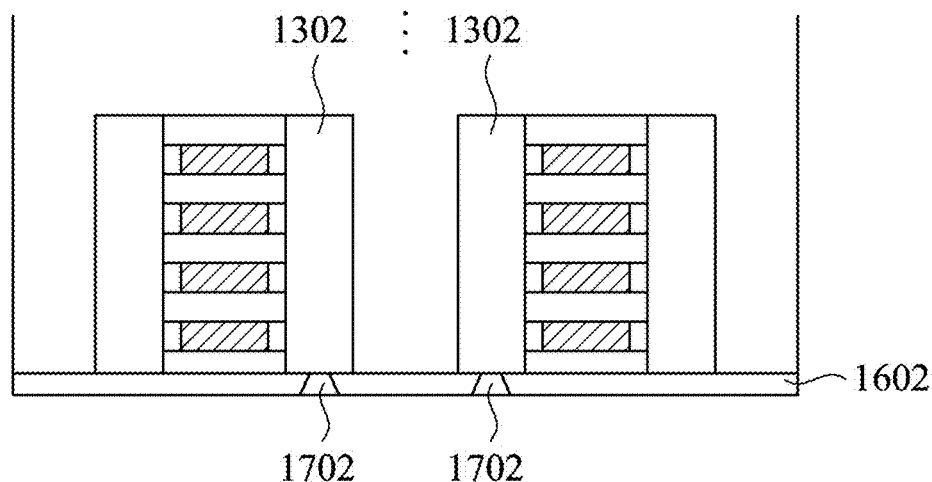
Figure 17B:
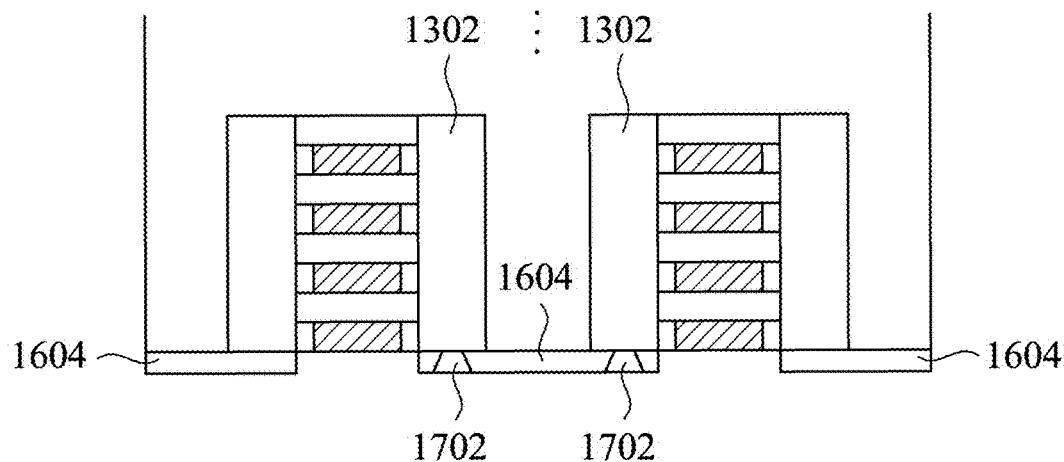

Corresponding to operation 624, FIG. 17A is a cross-sectional view of semiconductor device 600A including backside vias 1702 at one of the various stages of fabrication, and FIG. 17B is a cross-sectional view of semiconductor device 600B including backside vias 1702 at one of the various stages of fabrication. The cross-sectional views are cut along A-A indicated in FIG. 5. A portion of the bottom oxide layer 1602 is etched out and replaced with the backside vias 1702. These backside vias are formed to deliver power to the source/drain structures 1302 from the backside metal (see FIGS. 20A-20F).

Figure 18A:
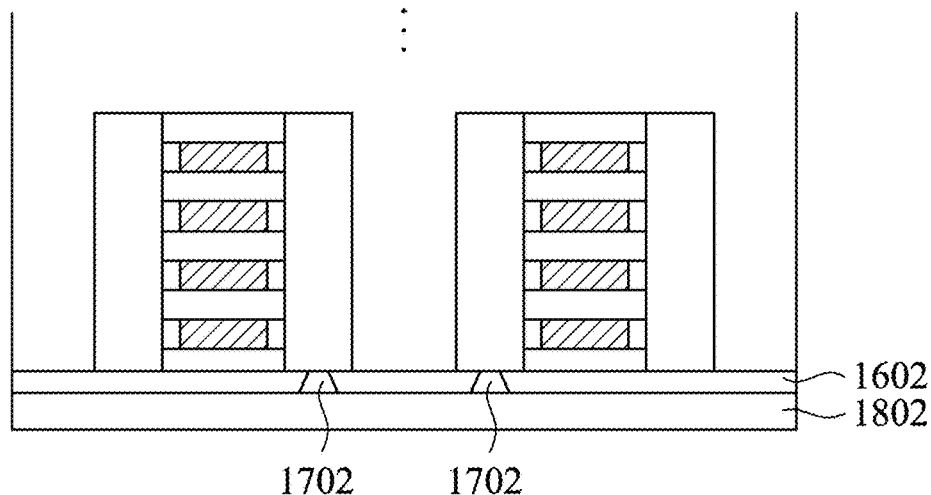
Figure 18B:
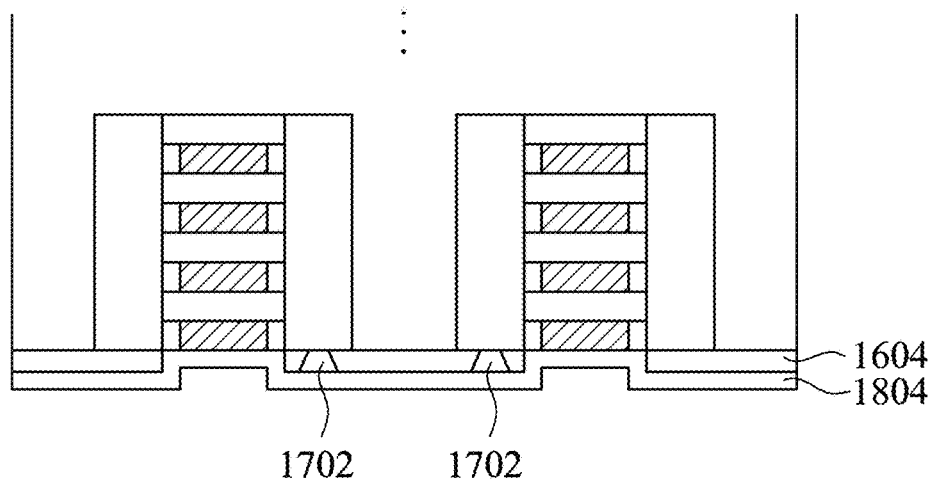

Corresponding to operation 626, FIG. 18A is a cross-sectional view of semiconductor device 600A including a spacer 1802, and FIG. 18B is a cross-sectional view of semiconductor device 600B including the spacer 1804 at one of the various stages of fabrication. The cross-sectional views are cut along A-A indicated in FIG. 5.

Referring to FIG. 18A, the spacer 1802 is formed over the bottom oxide layer 1602 and the backside vias 1702. Referring to FIG. 18B, the spacer 1804 is formed over the bottom oxide layer 1604 and the backside vias 1702.

The spacers 1802 and 1804 may be a low-k spacer and may be formed of a suitable dielectric material, such as silicon nitride, silicon oxide, silicon carbonitride, silicon oxycarbonitride, or the like. Any suitable deposition method, such as thermal oxidation, chemical vapor deposition (CVD), or the like, may be used to form the spacers 1802 and 1804. The shapes and formation methods of the spacers 1802 and 1804, as illustrated in FIGS. 18A and 18B, are merely non-limiting examples, and other shapes and formation methods are possible. These and other variations are fully intended to be included within the scope of the present disclosure.

Figure 19A:
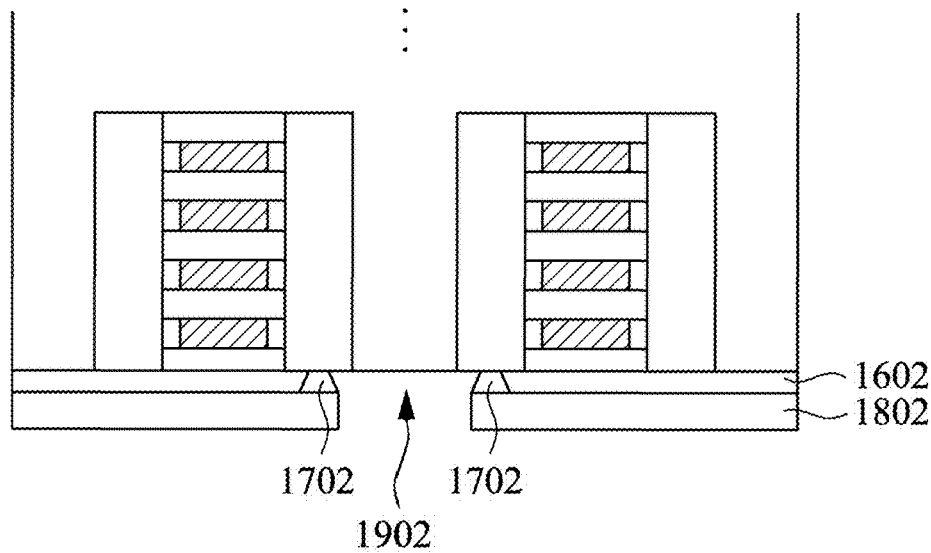
Figure 19B:
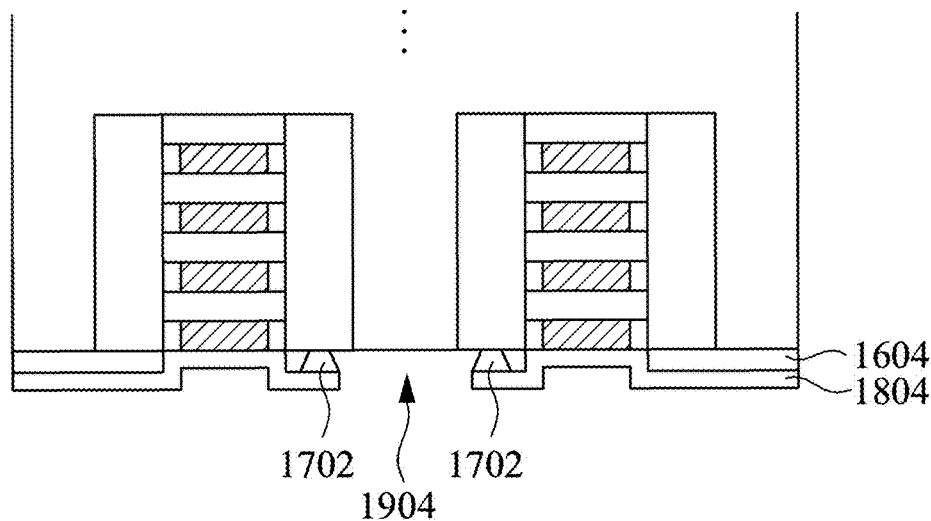

Corresponding to operation 628, FIG. 19A is a cross-sectional view of semiconductor device 600A including an opening 1902 at one of the various stages of fabrication, and FIG. 19B is a cross-sectional view of semiconductor device 600B including an opening 1904 at one of the various stages of fabrication. The cross-sectional views are cut along A-A indicated in FIG. 5. The shapes and formation methods of the spacers 1802 and 1804, as illustrated in FIGS. 19A and 19B, are merely non-limiting examples, and other shapes and formation methods are possible. These and other variations are fully intended to be included within the scope of the present disclosure.

The spacers 1802 and 1804 are etched to form the openings 1902 and 1904, respectively. The openings 1902 and 1904 expose the ILD 1306 of semiconductor devices 600A and 600B, respectively. As will be seen in FIGS. 20A-20F, the openings 1902 and 1904 may have various shapes and are not limited to the ones that are shown in the figures.

Corresponding to operation 630, FIGS. 20A-20F are cross-sectional views of semiconductor device 2000A, 2000B, 2000C, 2000D, 2000E, and 2000F including a backside interconnect structure 2002A, 2002B, 2002C, 2002D, 2002E, and 2002F, respectively, at one of the various stages of fabrication. The cross-sectional views are cut along A-A indicated in FIG. 5. The semiconductor devices 2000A-2000E are similar to the semiconductor devices 600A and 600B but the semiconductor devices 2000A-2000F also include backside interconnect structures. The frontside interconnect structures and various layers of the semiconductor devices 2000A-2000F are omitted from FIGS. 20A-20F for simplicity.

Figure 20A:
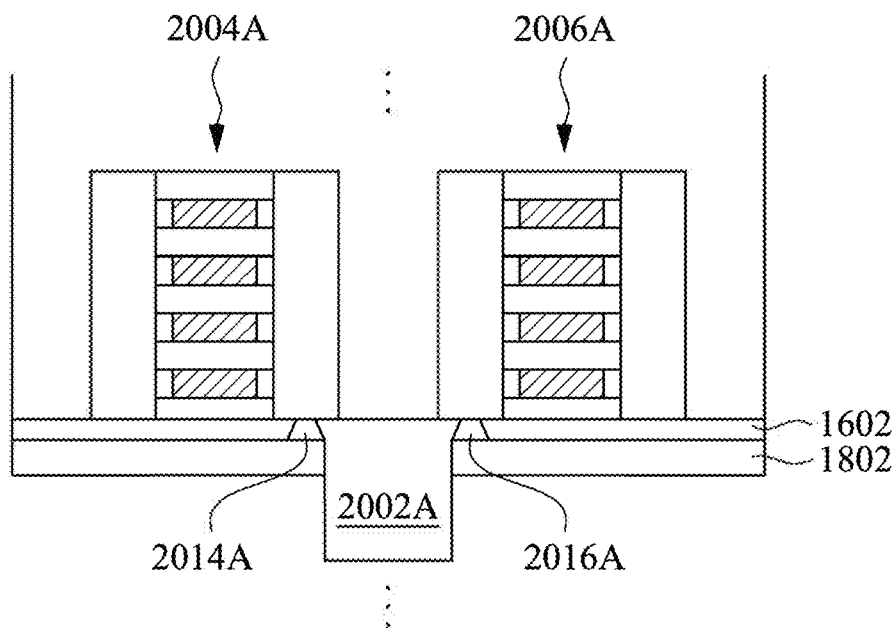

Referring to FIG. 20A, the semiconductor device 2000A includes a backside interconnect structure 2002A, a GAA transistor 2004A, a backside via 2014A, a GAA transistor 2006A, and a backside via 2016A. The semiconductor device 2000A was formed using a buried oxide layer that was formed in operation 604 (FIG. 8). The backside interconnect structure 2002A is coupled to the backside via 2014A which is coupled to the source/drain structure of the GAA transistor 2004A. The backside interconnect structure 2002A is also coupled to the backside via 2016A which is coupled to the source/drain structure of the GAA transistor 2006A. The backside interconnect structure 2002A does not overlap the channel regions of both the GAA transistor 2004A and the GAA transistor 2006A.

Figure 20B:
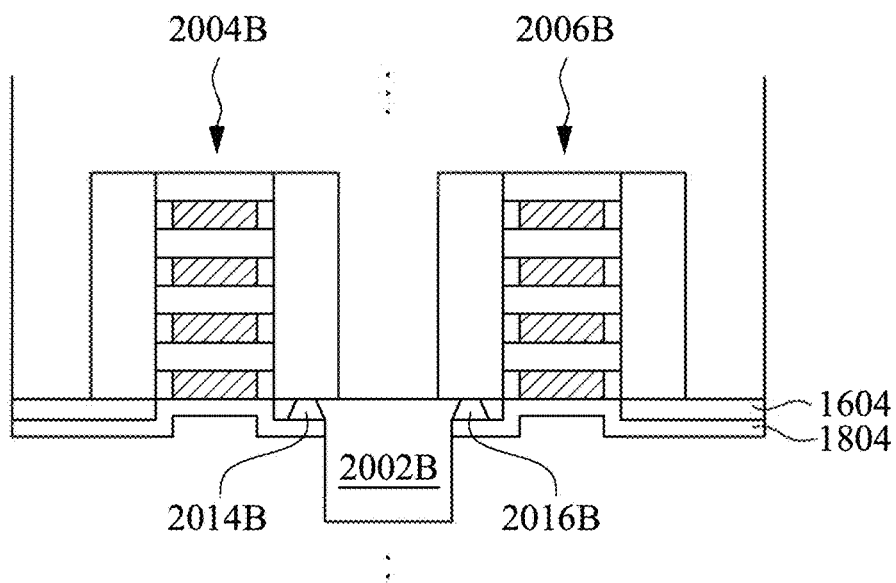

Referring to FIG. 20B, the semiconductor device 2000B includes a backside interconnect structure 2002B, a GAA transistor 2004B, a backside via 2014B, a GAA transistor 2006B, and a backside via 2016B. The semiconductor device 2000B was formed using a buried oxide layer that was formed in operation 614 (FIG. 12B). The backside interconnect structure 2002B is coupled to the backside via 2014B which is coupled to the source/drain structure of the GAA transistor 2004B. The backside interconnect structure 2002B is also coupled to the backside via 2016B which is coupled to the source/drain structure of the GAA transistor 2006B. The backside interconnect structure 2002B does not overlap the channel regions of both the GAA transistor 2004B and the GAA transistor 2006B.

Figure 20C:
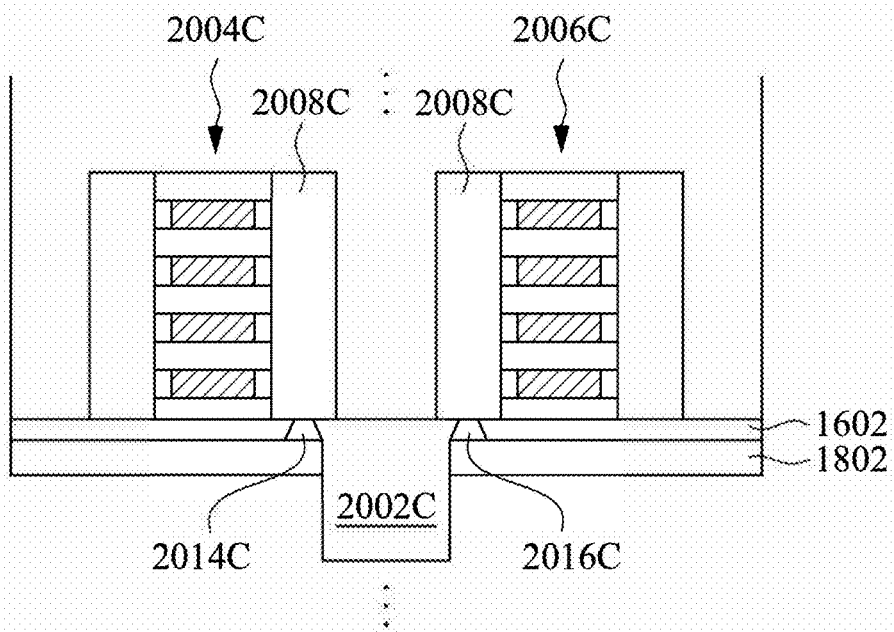

Referring to FIG. 20C, the semiconductor device 2000C includes a backside interconnect structure 2002C, a GAA transistor 2004C, a backside via 2014C, a GAA transistor 2006C, and a backside via 2016C. The semiconductor device 2000C was formed using a buried oxide layer that was formed in operation 604 (FIG. 8). The backside interconnect structure 2002C is coupled to the backside via 2014C which is coupled to the source/drain structure 2008C of the GAA transistor 2004C. However, unlike in FIGS. 20A and 20B, the backside interconnect structure 2002C is not coupled to the backside via 2016C. In this embodiment, the backside interconnect structure 2002C delivers power to the source/drain structure 2008C of the GAA transistor 2004C through the backside via 2014C, but not the GAA transistor 2006C. Still, the backside interconnect structure 2002C does not overlap the channel regions of both the GAA transistor 2004C and the GAA transistor 2006C.

Figure 20D:
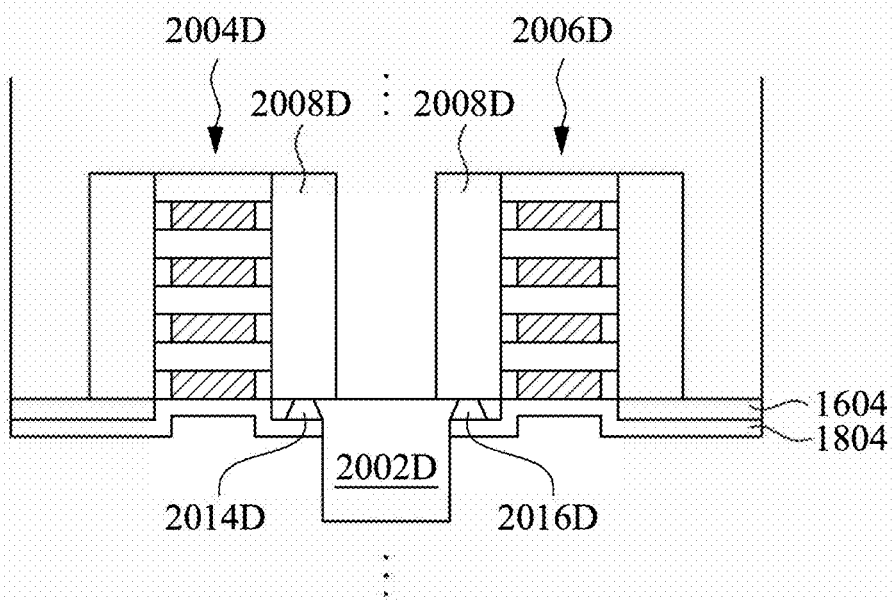

Referring to FIG. 20D, the semiconductor device 2000D includes a backside interconnect structure 2002D, a GAA transistor 2004D, a backside via 2014D, a GAA transistor 2006D, and a backside via 2016C. The semiconductor device 2000D was formed using a buried oxide layer that was formed in operation 614 (FIG. 12B). The backside interconnect structure 2002D is coupled to the backside via 2014D which is coupled to the source/drain structure 2008D of the GAA transistor 2004D. However, unlike in FIGS. 20A and 20B, the backside interconnect structure 2002D is not coupled to the backside via 2016D. In this embodiment, the backside interconnect structure 2002D delivers power to the source/drain structure 2008D of the GAA transistor 2004D through the backside via 2014D, but not the GAA transistor 2006D. Still, the backside interconnect structure 2002D does not overlap the channel regions of both the GAA transistor 2004D and the GAA transistor 2006D.

Figure 20E:
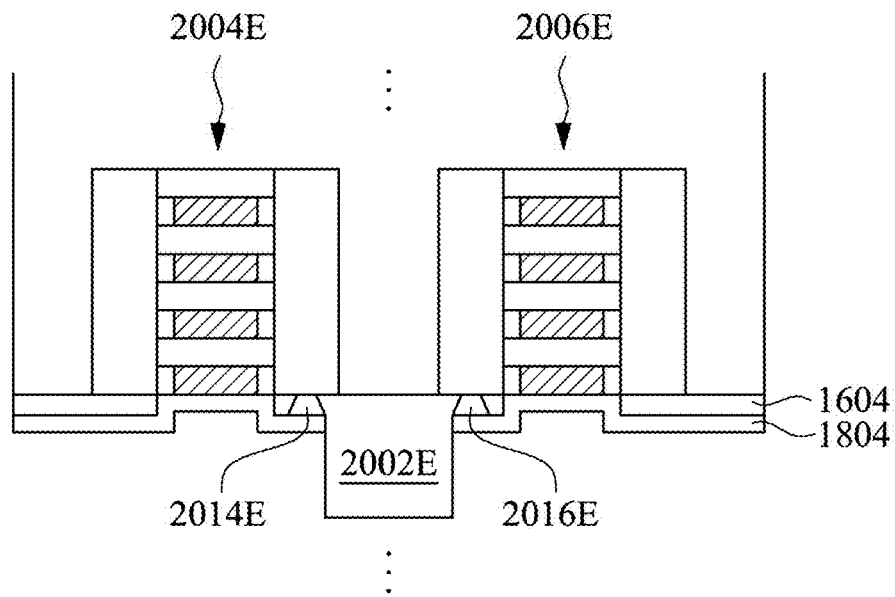

Referring to FIG. 20E, the semiconductor device 2000E includes a backside interconnect structure 2002E, a GAA transistor 2004E, a backside via 2014E, and a GAA transistor 2006E. The semiconductor device 2000E was formed using a buried oxide layer that was formed in operation 614 (FIG. 12B). The backside interconnect structure 2002E is coupled to the backside via 2014E which is coupled to the source/drain structure 2008E of the GAA transistor 2004E. However, unlike in FIGS. 20A-20D, the GAA transistor 2006E does not have a backside via attached to its source/drain structure 2008E. In this embodiment, the backside interconnect structure 2002E delivers power to the source/drain structure 2008E of the GAA transistor 2004E through the backside via 2014E. Still, the backside interconnect structure 2002E does not overlap the channel regions of both the GAA transistor 2004E and the GAA transistor 2006E.

Figure 20F:
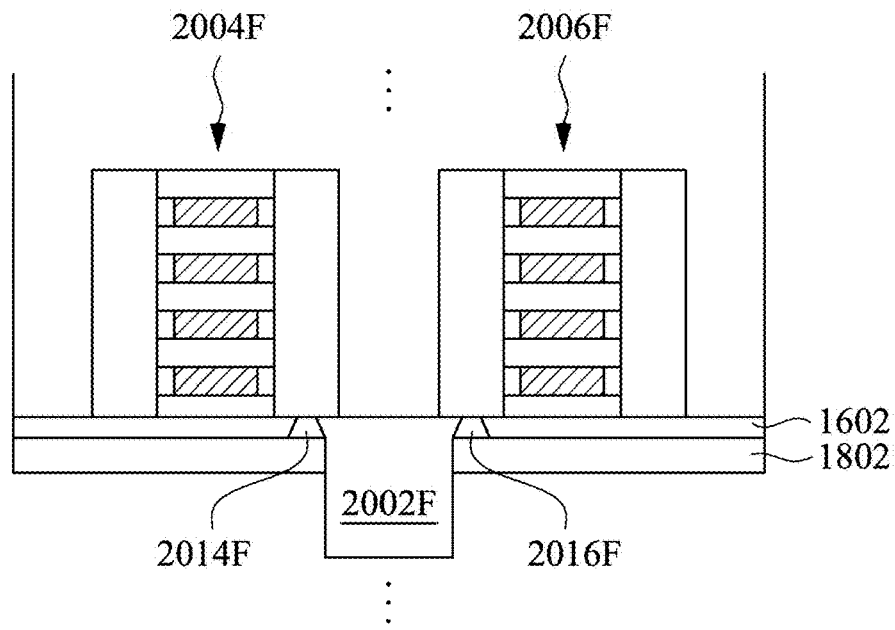

Referring to FIG. 20F, the semiconductor device 2000F includes a backside interconnect structure 2002F, a GAA transistor 2004F, a backside via 2014F, a GAA transistor 2006F, and a backside via 2016F. The semiconductor device 2000F was formed using a buried oxide layer that was formed in operation 604 (FIG. 8). The backside interconnect structure 2002F is coupled to the backside via 2014F which is coupled to the source/drain structure of the GAA transistor 2004F. The backside interconnect structure 2002F is also coupled to the backside via 2016F which is coupled to the source/drain structure of the GAA transistor 2006F. Accordingly, the backside interconnect structure 2002F overlaps the backside vias 2014F and 2016F to form a bone-like shape. The backside interconnect structure 2002F does not overlap the channel regions of both the GAA transistor 2004F and the GAA transistor 2006F.

Furthermore, in any of the FIGS. 20A-20F, although it may not be shown, the backside interconnect structures 2002A-2002F may extend to overlap the backside vias 2014A-2014F and/or 2016A-2016F.

Figure 21:
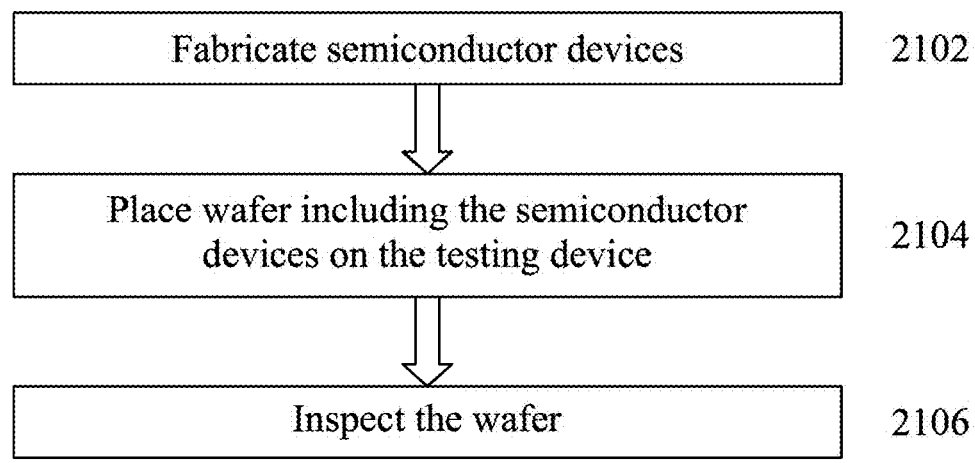
FIG. 21 illustrates a flow chart of an example method of inspecting the semiconductor device of FIG. 6 using a tester, in accordance with some embodiments.

FIG. 21 illustrates a flow chart of an example method of testing the semiconductor device 2000A-2000E of FIGS. 20A-20E using a tester, in accordance with some embodiments. It should be noted that process 2100 is merely an example and is not intended to limit the present disclosure. Accordingly, it is understood that additional steps/operations may be provided before, during, and after process 2100 of FIG. 21, and that some other operations may only be briefly described herein.

In brief overview, the process 2100 starts with operation 2102 of fabricating the semiconductor devices. Then process 2100 can proceed to operation 2104 of placing a wafer including the semiconductor devices on the tester systems. Then the process 2100 can proceed to operation 2106 of inspecting the wafer.

Corresponding to operation 2102, the semiconductor devices can be fabricated on wafer according to process 600. One of ordinary skill will recognize that the wafer does not have to go through the entire process 600 of fabricating the semiconductor devices before the wafer is tested in the tester. In other words, a user can place the wafer in the tester at any stage in the fabrication process. 600.

Corresponding to operation 2104, the wafer is positioned in the tester system where the user is able to test a desired place on the wafer. This process can be automatic or manual, depending on the tester and user's preference.

Corresponding to operation 2106, the semiconductor devices are tested on the tester. As discussed above, any suitable tester system can be used, such as EMMI, EBI, or OBIRCH. When using this tester, the signal (electron, light, etc.) that gets generated or transmitted by the tester through the channel region does not get absorbed by the backside interconnect structures. Accordingly, the user is able to accurately detect any defects in the semiconductor devices.

In one aspect of the present disclosure, a semiconductor device is disclosed. The semiconductor device includes a first active region that extends along a first lateral direction and includes a plurality of first epitaxial structures. The semiconductor device includes an interconnect structure that extends along the first lateral direction and is disposed below the first active region, wherein at least one of the plurality of first epitaxial structures is electrically coupled to the interconnect structure. The interconnect structure includes at least a first portion that offsets from the first active region along a second lateral direction perpendicular to the first lateral direction.

In another aspect of the present disclosure, a semiconductor device is disclosed. The semiconductor device includes a plurality of first source/drain structures laterally disposed along a first lateral direction, wherein the plurality of first source/drain structures are separated from each other with a plurality of first gate structures that extend along a second lateral direction perpendicular to the first lateral direction. The semiconductor device also includes a interconnect structure that extends along the first lateral direction and is disposed below the plurality of first source/drain structures. At least one of the plurality of first source/drain structures extends beyond a first sidewall of the interconnect structure along the second lateral direction In yet another aspect of the present disclosure, a method for testing a semiconductor device is disclosed. The method includes forming a plurality of transistors on a first side of the semiconductor substrate, wherein the plurality of transistors includes a plurality of source/drain structures. The method also includes electrically coupling the plurality of transistors to one another by forming a plurality of first interconnect structures on the first side. The method further includes forming a second interconnect structure on a second side of the semiconductor substrate opposite to the first side, wherein the second interconnect structure includes a portion that exposes at least some of the source/drain structures with no metal structure disposed therebetween.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first active region that extends along a first lateral direction and comprises a plurality of first epitaxial structures; and
   an interconnect structure that extends along the first lateral direction and is disposed below the first active region, wherein at least one of the plurality of first epitaxial structures is electrically coupled to the interconnect structure;
   wherein the interconnect structure includes at least a first portion overlapped with the first active region, and a second portion protruding from the first portion along a second lateral direction perpendicular to the first lateral direction.

2. The semiconductor device of claim 1, wherein the interconnect structure includes a power rail configured to carry a supply voltage.

3. The semiconductor device of claim 1, further comprising a plurality of metal gate structures that extend along the second lateral direction and are disposed over respective portions of the first active region.

4. The semiconductor device of claim 3, wherein the at least first portion of the interconnect structure extends across at least some of the plurality of metal gate structures.

5. The semiconductor device of claim 3, wherein the portions of the first active region, respectively overlaid by the metal gate structures, each include a plurality of nanostructures vertically separated from each other.

6. The semiconductor device of claim 1, wherein the second portion overlaps with the at least one first epitaxial structure.

7. The semiconductor device of claim 6, further comprising a via structure that is disposed below the at least one first epitaxial structure and electrically connects the interconnect structure to the at least one first epitaxial structure.

8. The semiconductor device of claim 1, further comprising:
   a second active region that also extends along the first lateral direction and comprises a plurality of second epitaxial structures;
   wherein at least one of the plurality of second epitaxial structures is electrically coupled to the interconnect structure disposed below the second active region; and
   wherein the at least first portion of the interconnect structure laterally offsets from the second active region along the second lateral direction.

9. The semiconductor device of claim 8, wherein the interconnect structure includes at least a pair of second portions that protrude from the first portion along the second lateral direction and respectively overlap with the at least one first epitaxial structure and the at least one second epitaxial structure.

10. The semiconductor device of claim 9, further comprising:
    a first via structure that is disposed below the at least one first epitaxial structure and electrically connects the interconnect structure to the at least one first epitaxial structure; and
    a second via structure that is disposed below the at least one second epitaxial structure and electrically connects the interconnect structure to the at least one second epitaxial structure;
    wherein the first epitaxial structure has a first conductive type, and the second epitaxial structure has a second conductive type, the first conductive type being equal or opposite to the second conductive type.

11. A semiconductor device, comprising:
    a plurality of first source/drain structures laterally disposed along a first lateral direction, wherein the plurality of first source/drain structures are separated from each other with a plurality of first gate structures that extend along a second lateral direction perpendicular to the first lateral direction; and
    an interconnect structure that extends along the first lateral direction and is disposed below the plurality of first source/drain structures;

wherein, along the second lateral direction, at least one of the plurality of first source/drain structures extends beyond a first sidewall of the interconnect structure extending along the first lateral direction; and wherein the interconnect structure includes at least one second portion that protrudes from a first portion of the interconnect structure along the second lateral direction.

12. The semiconductor device of claim 11, further comprising:
a plurality of second source/drain structures laterally disposed along the first lateral direction, wherein the plurality of second source/drain structures are separated from each other with a plurality of second gate structures that extend along the second lateral direction;
wherein at least one of the plurality of second source/drain structures extends beyond a second sidewall of the interconnect structure along the second lateral direction.

13. The semiconductor device of claim 12, wherein the interconnect structure is configured to provide a supply voltage to one or more of the plurality of first source/drain structures and one or more of the plurality of second source/drain structures.

14. The semiconductor device of claim 12, wherein the first source/drain structures have a first conductive type, and the second source/drain structures have a second conductive type, and wherein the first and second conductive types are equal or opposite to each other.

15. The semiconductor device of claim 11, further comprising a metal via structure that is disposed below the at least one first source/drain structure and electrically couples the interconnect structure to the at least one first source/drain structure.

16. The semiconductor device of claim 11, further comprising a dielectric structure that is disposed below the at least one first source/drain structure and electrically decouples the interconnect structure from the at least one first source/drain structure.

17. The semiconductor device of claim 11, further comprising a channel disposed between adjacent ones of the plurality of first source/drain structures, wherein the channel includes a plurality of nanostructures that extend along the first lateral direction and are separated from each other along a vertical direction.

18. The semiconductor device of claim 11, wherein the second portion overlaps with one of the first source/drain structures.

19. The semiconductor device of claim 11, further comprising a via structure that is disposed below the one of the first source/drain structures and electrically connects the interconnect structure to the one of the first source/drain structures.

20. The semiconductor device of claim 11, wherein the interconnect structure includes at least a pair of second portions that protrude from a first portion of the interconnect structure along the second lateral direction and respectively overlap with one of the first source/drain structures and another of the first source/drain structures.

21. A semiconductor device, comprising:
an active region that extends along a first lateral direction and comprises a plurality of epitaxial structures; and
an interconnect structure that extends along the first lateral direction and is disposed below the active region;
wherein the interconnect structure includes a first portion extending along the first lateral direction, and one or more second portions each protruding from the first portion along a second lateral direction perpendicular to the first lateral direction.

22. The semiconductor device of claim 21, wherein the interconnect structure includes a power rail configured to carry a supply voltage.

23. The semiconductor device of claim 21, further comprising a plurality of metal gate structures that extend along the second lateral direction and are disposed over respective portions of the active region.

24. The semiconductor device of claim 21, wherein the second portion of the interconnect structure overlaps with one of the first epitaxial structures that is electrically coupled to the interconnect structure.

\* \* \* \* \*